US011185000B2

(12) United States Patent
Utsumi

(10) Patent No.: US 11,185,000 B2
(45) Date of Patent: Nov. 23, 2021

(54) MOUNTING SHAFT DEVICE, MOUNTING HEAD, AND SURFACE MOUNTER

(71) Applicant: Yamaha Hatsudoki Kabushiki Kaisha, Iwata (JP)

(72) Inventor: Tomoyoshi Utsumi, Iwata (JP)

(73) Assignee: YAMAHA HATSUDOKI KABUSHIKI KAISHA, Shizuoka (JP)

( * ) Notice: Subject to any disclaimer, the term of this patent is extended or adjusted under 35 U.S.C. 154(b) by 536 days.

(21) Appl. No.: 15/773,522

(22) PCT Filed: Nov. 11, 2015

(86) PCT No.: PCT/JP2015/081773
§ 371 (c)(1),
(2) Date: May 3, 2018

(87) PCT Pub. No.: WO2017/081775
PCT Pub. Date: May 18, 2017

(65) Prior Publication Data
US 2018/0324989 A1 Nov. 8, 2018

(51) Int. Cl.
H05K 13/04 (2006.01)
F16H 25/22 (2006.01)
F16H 25/20 (2006.01)

(52) U.S. Cl.
CPC ....... H05K 13/0409 (2018.08); H05K 13/041 (2018.08); H05K 13/046 (2013.01);
(Continued)

(58) Field of Classification Search
CPC ............. H05K 13/0409; H05K 13/041; H05K 13/0413; H05K 13/0417; H05K 13/046;
(Continued)

(56) References Cited

U.S. PATENT DOCUMENTS 5,622,434 A * 4/1997 Takahashi ............... F16C 31/04
384/49
5,758,410 A * 6/1998 Asai ................... H05K 13/0413
29/740
(Continued)

FOREIGN PATENT DOCUMENTS

JP H11-097893 A 4/1999
JP 1999097893 * 9/1999 ............. H05K 13/04
(Continued)

OTHER PUBLICATIONS

An Office Action mailed by The State Intellectual Property Office of People's Republic of China dated Sep. 16, 2019, which corresponds to Chinese Patent Application No. 201580084491.5 and is related to U.S. Appl. No. 15/773,522.
(Continued)

*Primary Examiner* — Minh N Trinh
(74) *Attorney, Agent, or Firm* — Studebaker & Brackett PC

(57) ABSTRACT

A mounting shaft device comprises a spline shaft including a supply passage for air pressure that extends through a shaft hole in a support, a conduit in communication with a valve and allowing the air pressure from the valve to be introduced to the supply passage, a component retainer disposed at an axial end of the spline shaft and configured to hold an electronic component by using the air pressure applied through the supply passage, a spline nut connected to the spline shaft through a spline mechanism, and a bearing supporting the spline shaft in the shaft hole in the support both in a linearly movable manner in an axial direction and in a rotatable manner about an axis thereof. The bearing, the conduit, and the spline nut are arranged on an axis of the spline shaft in this order from the component retainer.

20 Claims, 20 Drawing Sheets

(52) U.S. Cl.
CPC ..... *H05K 13/0413* (2013.01); *H05K 13/0417* (2013.01); *F16H 25/2204* (2013.01); *F16H 2025/204* (2013.01)

(58) Field of Classification Search
CPC ............ H05K 13/0406; F16H 25/2204; F16H 2025/204; F16C 19/10; F16C 29/04; F16C 29/067
See application file for complete search history.

(56) References Cited

U.S. PATENT DOCUMENTS

| | | | | |
|---|---|---|---|---|
| 2001/0018369 | A1* | 8/2001 | Cermak | ............. F16C 33/3806 464/167 |
| 2002/0000359 | A1* | 1/2002 | Asai | ..................... H05K 13/041 198/346.2 |
| 2018/0324989 | A1* | 11/2018 | Utsumi | ................ H05K 13/041 |

FOREIGN PATENT DOCUMENTS

| | | | | |
|---|---|---|---|---|
| JP | 2005-327774 | A | 11/2005 | |
| JP | 2008-249073 | A | 10/2008 | |
| JP | 2011-029527 | A | 2/2011 | |
| JP | 2011-075005 | A | 4/2011 | |
| JP | 2011029527 | * | 10/2011 | ............. H05K 13/04 |
| JP | 2013135150 | * | 8/2013 | ............. H05K 13/04 |
| WO | 98/29221 | A1 | 7/1998 | |

OTHER PUBLICATIONS

An Office Action mailed by the Japanese Patent Office dated Dec. 18, 2018, which corresponds to Japanese Patent Application No. 2017-549923 and is related to U.S. Appl. No. 15/773,522.

International Search Report issued in PCT/JP2015/081773; dated Feb. 16, 2016.

* cited by examiner

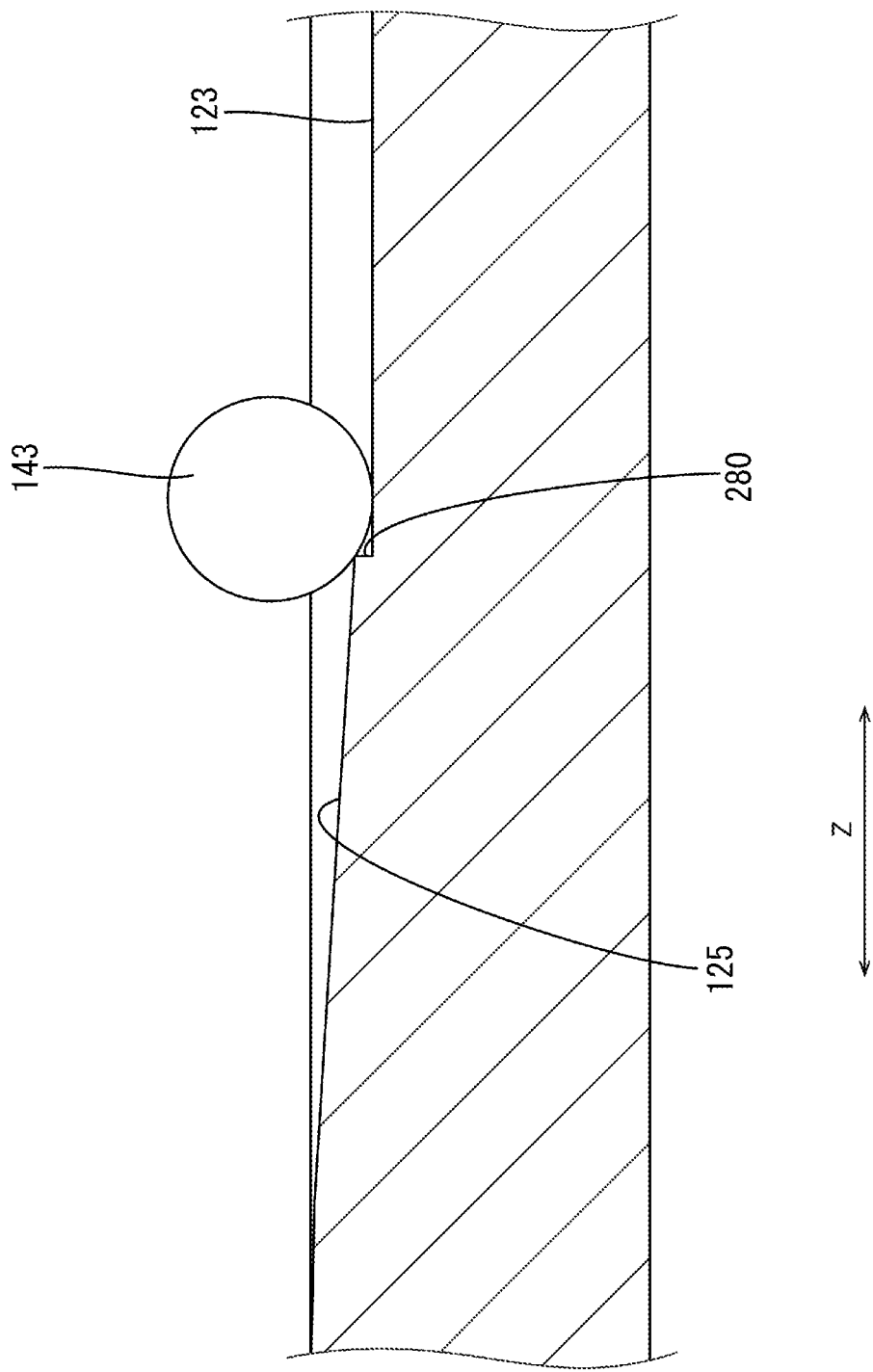

MOUNTING SHAFT DEVICE, MOUNTING HEAD, AND SURFACE MOUNTER

CROSS-REFERENCE TO RELATED APPLICATION

This application is a National Stage of International Patent Application No. PCT/JP2015/081773, filed Nov. 11, 2015, the entire content of which is incorporated herein by reference.

BACKGROUND

Technical Field

The technology disclosed herein relates to a structure of a mounting shaft device mounted in a mounting head of a surface mounter, for example.

Background Art

In a known technique, spline coupling is employed to move a shaft linearly in the axial direction and to rotate the shaft about the axis. Such a technique is employed in a mounting head of a surface mounter that is configured to mount an electronic component on a printed circuit board, for example. Specifically described, the technique is employed in a shaft that moves up/down and rotates the pickup nozzles.

In Japanese Patent Application Publication No. 2005-327774, a pickup head is composed of separate components including a lower nozzle shaft and an upper nozzle shaft detachably attached to an upper end of the lower nozzle shaft by a shaft coupling. This configuration enables components, such as a pickup nozzle and a lower nozzle shaft, to be replaced as needed, reducing time required for replacement of the components.

Furthermore, in Japanese Patent Application Publication No. 2005-327774, the lower nozzle shaft and the upper nozzle shaft each have an air passage at their core. The air passage extends through the lower and upper nozzle shafts in the axial direction. An air pipe is connected to an upper end of the upper nozzle shaft. Air pressure is applied to the pickup nozzle through the air pipe and the air passages in the shafts.

SUMMARY

Electronic components to be mounted on printed circuit boards have been downsized recently, requiring improvement in mounting precision of electronic components. In addition, a reduction in a response time, which is required for switching of air pressures to be applied to the pickup nozzle, is important in order to reduce mounting takt time. Thus, it is desired to improve mounting precision of electric components and reduce a response time required for switching of air pressures.

The technology disclosed herein is made in view of the above-described problem, and an object is to improve mounting precision of an electronic component and to reduce a response time required for switching of air pressures.

A mounting shaft device disclosed herein includes a spline shaft including a supply passage for air pressure therein and extending through a shaft hole in a support, a conduit being in communication with a valve and allowing the air pressure from the valve to be introduced to the supply passage of the spline shaft, a component retainer disposed at an axial end of the spline shaft and configured to receive the air pressure applied through the supply passage of the spline shaft to hold an electronic component, a spline nut connected to the spline shaft through a spline mechanism, and a bearing supporting the spline shaft in the shaft hole in the support both in a linearly movable manner in an axial direction and in a rotatable manner about an axis thereof. The bearing, the conduit, and the spline nut are arranged on an axis of the spline shaft in this order from the component retainer.

In this configuration, the bearing, the conduit, and the spline nut are disposed on the axis of the spline shaft in this order from the component retainer. This improves mounting precision of an electronic component and reduces time required for switching of air pressures.

The following configurations are preferable aspects of the mounting shaft device disclosed herein.

The conduit may have a tubular shape. The conduit and the spline shaft define an air chamber in communication with the supply passage therebetween. The conduit may have a communication hole in a peripheral wall of the air chamber. The communication hole is in communication with the valve. This configuration allows the air pressure from the valve to be introduced to the supply passage in the spline shaft through the communication hole and the air chamber.

The spline shaft may have a ball groove extending in an axial direction of the spline shaft and receiving a ball connecting the spline shaft and the spline nut to each other through a spline mechanism. The spline shaft may have a restrictor at an end portion of the ball groove. The restrictor is configured to restrict the ball from getting stuck in an incomplete groove. The "incomplete groove" is a groove having an incomplete groove shape that has a small width or a small depth compared with a normal groove shape of the ball groove. The above-described configuration restricts the ball from getting stuck in the incomplete groove. Thus, malfunction of the spline shaft in linear axial movement is reduced.

The spline shaft may have an annular groove having an annular shape at a border between the incomplete groove and the ball groove. The restrictor may be a ball stopper disposed in the annular groove at the border between the incomplete groove and the ball groove. The ball stopper may be configured to restrict the ball in the ball groove from moving into the incomplete groove. In this configuration, the ball stopper restricts the ball in the ball groove from moving into the incomplete groove, restricting the ball from getting stuck in the incomplete groove.

The restrictor may be a step at the border between the incomplete groove and the ball groove. In this configuration, the step restricts the ball in the ball groove from moving into the incomplete groove, restricting the ball from getting stuck in the incomplete groove.

The restrictor may be a filler filling the incomplete groove. In this configuration, the filler restricts the ball in the ball groove from moving into the incomplete groove, restricting the ball from getting stuck in the incomplete groove.

A mounting head disclosed herein includes the above-described mounting shaft device, a base including a through hole in which the conduit and the support are disposed one above the other and through which the spline shaft extends in the axial direction, the valve in a mounting hole in the base and in communication with the conduit, an axial driver configured to move the spline shaft in the axial direction, and a rotational drive unit configured to transmit torque to the spline nut to rotate the spline shaft about an axis thereof.

The technology disclosed herein improves mounting precision of electronic components and reduces a response time required for switching of air pressures.

BRIEF DESCRIPTION OF THE DRAWINGS

FIG. 20 is a cross-sectional view illustrating another embodiment of the spline shaft.

DETAILED DESCRIPTION (Overall Configuration of Surface Mounter)

Figure 1:
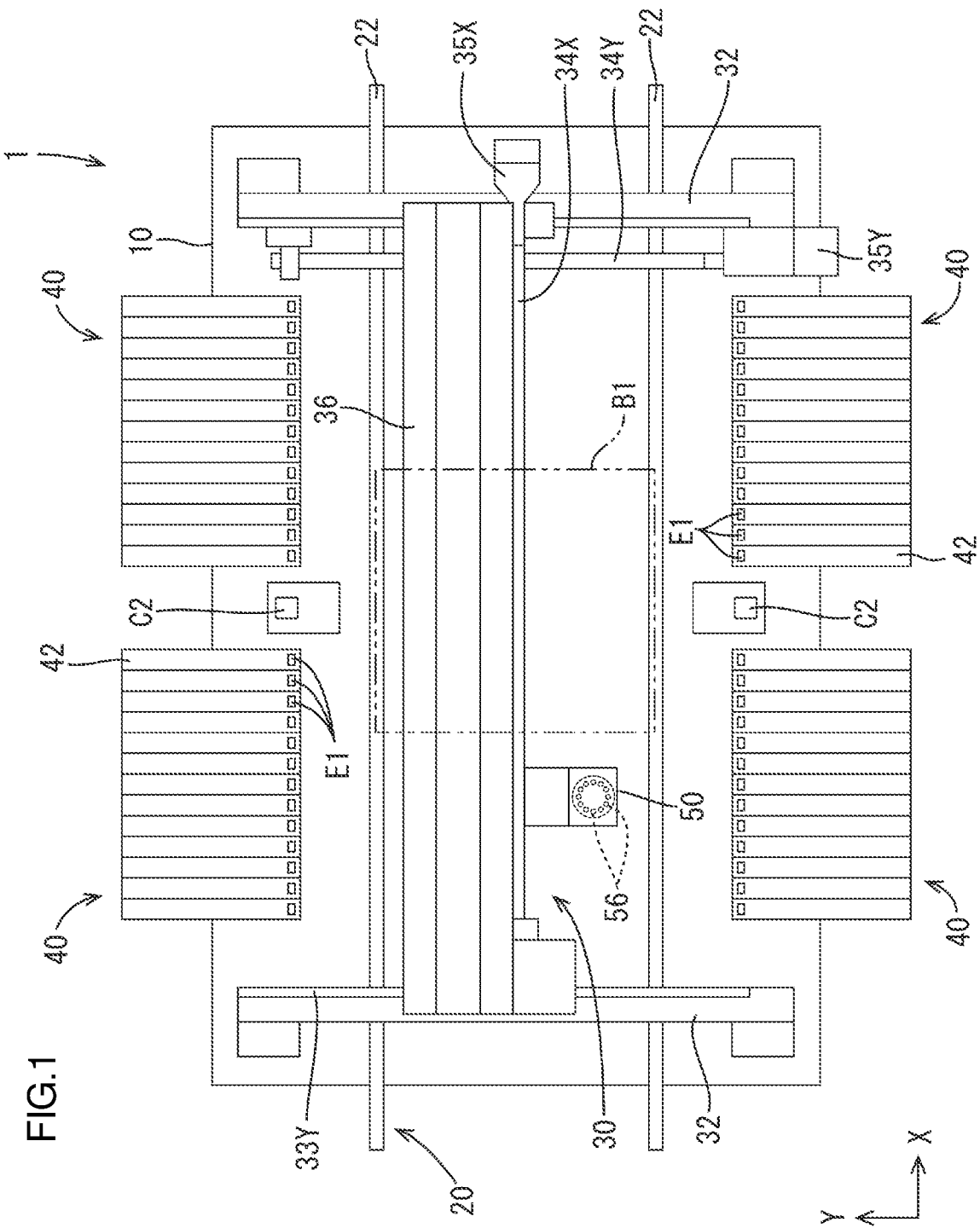
FIG. 1 is a plan view of a surface mounter adapted as an embodiment.

An embodiment is described with reference to the drawings. In this embodiment, a surface mounter 1 illustrated in FIG. 1 is described as an example. The surface mounter 1 includes a base 10, a transfer conveyor 20 configured to transfer a printed circuit board (one example of a board) B1, a component mounting device 30 configured to mount an electronic component (one example of a component) E1 on the printed circuit board B1, and component feeding portions 40, for example.

The base 10 has an oblong shape in plan view and has a flat upper surface. A backup device for supporting the printed circuit board B1 during mounting of the electronic component E1 on the printed circuit board B1 is provided below the transfer conveyor 20 on the base 10. In the following description, the longitudinal direction of the base 10 (the left-right direction in FIG. 1) and the transfer direction of the transfer conveyor 20 are referred to as an X direction. The width direction of the base 10 (the up-down direction in FIG. 1) is referred to as a Y direction. The up-down direction of the base 10 (the up-down direction in FIG. 2) is referred to as a Z direction.

The transfer conveyor 20 is located at the substantially middle of the base 10 in the Y direction and is configured to transfer the printed circuit board B1 in the transfer direction (the X direction). The transfer conveyor 20 includes a pair of conveyor belts 22 configured to circulate in the transfer direction. The printed circuit board B1 is positioned across the conveyor belts 22. The printed circuit board B1 is transferred from one side in the transfer direction (the right side in FIG. 1) along the conveyor belts 22 to an operation position (an area surrounded by a two-dot chain line in FIG. 1) on the base 10 where the printed circuit board B1 is stopped for the mounting operation of the electronic component E1. Then, the printed circuit board B1 is transferred to the other side (the left side in FIG. 1) along the conveyor belts 22 and discharged.

Two component feeding portions 40 are arranged side by side in the X direction on each side of the transfer conveyor 20 (each side in the up-down direction in FIG. 1), i.e., the total of four component feeding portions 40. The component feeding portions 40 each include a plurality of feeders 42. The feeders 42, which are component feeding devices, are arranged side by side. The feeders 42 each include a reel (not illustrated), around which a component feeding tape (not illustrated) holding the electronic components E1 is wound, and an electrical unwinding device (not illustrated), which is configured to unwind the component feeding tape from the reel, for example. The feeder 42 supplies the electronic components E1 one by one from component feeding positions located at the end adjacent to the transfer conveyor.

The component mounting device 30 includes a pair of supporting frames 32, a rotary type mounting head 50, and a mounting head drive mechanism configured to drive the mounting head 50. The supporting frames 32 extending in the Y direction are positioned at the both sides of the base 10 in the X direction.

A Y-axis servomechanism includes Y-axis guide rails 33Y, a Y-axis ball screw 34Y on which a ball nut (not illustrated) is threadably mounted, and a Y-axis servomotor 35Y. A head support 36 fixed to the ball nut is attached to each Y-axis guide rail 33Y. The ball nut is moved forward or backward along the Y-axis ball screw 34Y when the Y-axis servomotor 35Y is energized. This moves the head support 36 fixed to the ball nut and the mounting head 50, which will be described later, in the Y direction along the Y-axis guide rails 33Y.

The X-axis servomechanism includes an X-axis guide rail (not illustrated), an X-axis ball screw 34X on which a ball nut (not illustrated) is threadably mounted, and an X-axis servomotor 35X. The mounting head 50 is attached to the X-axis guide rail in a movable manner in the axial direction of the X-axis guide rail. The ball nut is moved forward or backward along the X-axis ball screw 34X when the X-axis servomotor 35X is energized. This moves the mounting head 50 fixed to the ball nut in the X direction along the X-axis guide rail.

As described above, the mounting head 50 is movable in the X direction and the Y direction in a predetermined range of movement by the X-axis servomechanism and the Y-axis servomechanism.

(Structure of Mounting Head)

Figure 2:
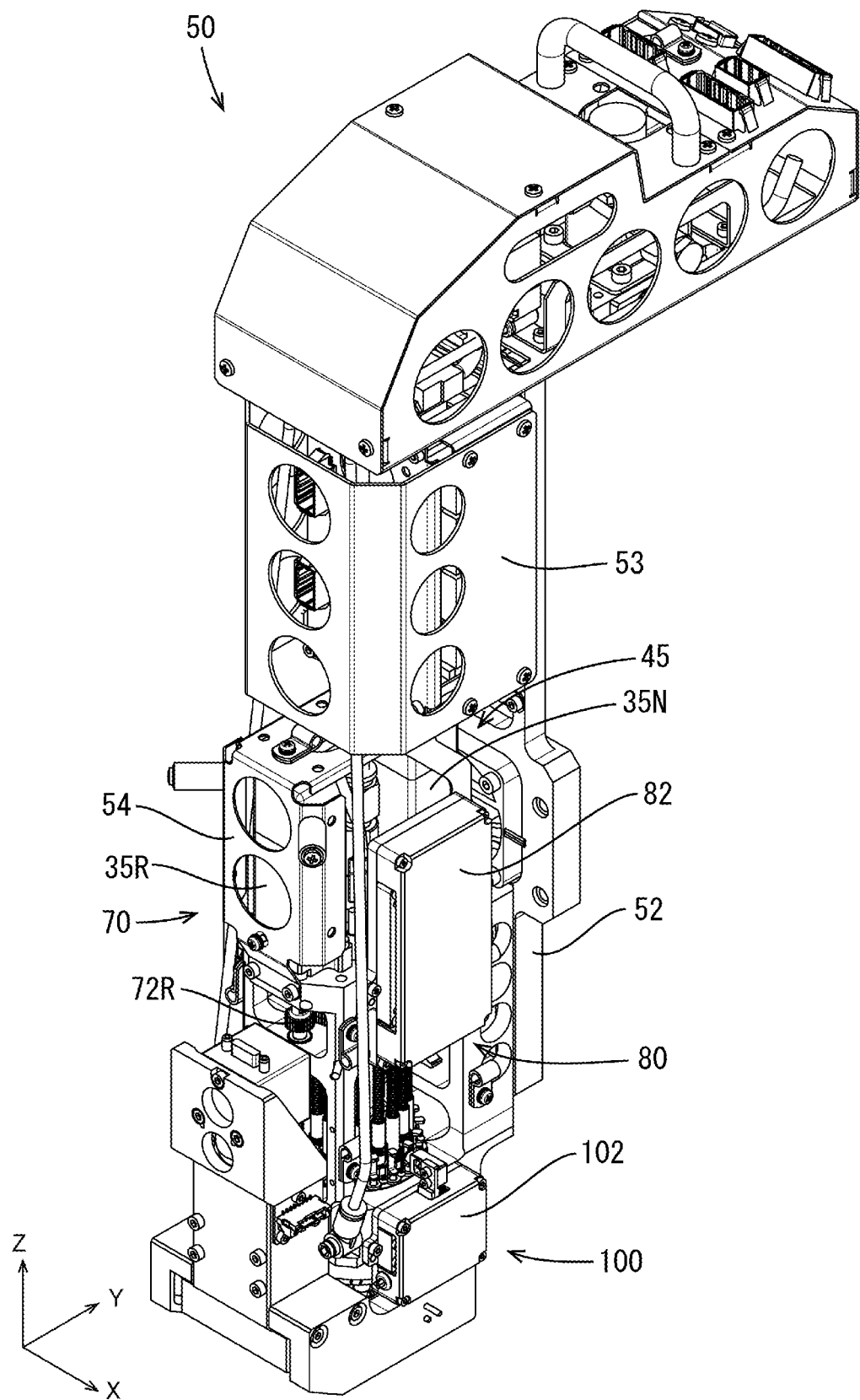
FIG. 2 is a perspective view of a mounting head.
Figure 3:
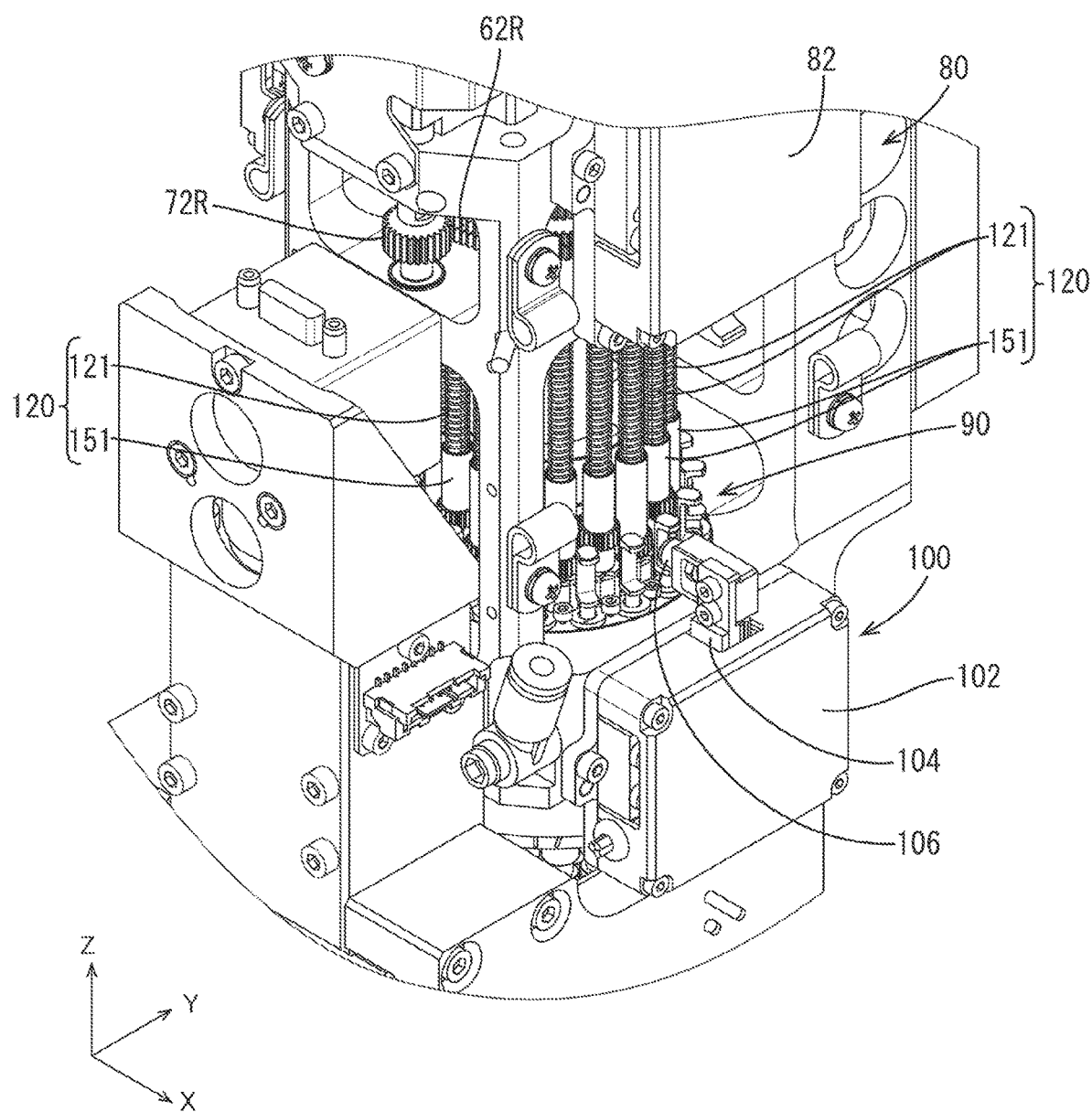
FIG. 3 is a magnified perspective view of a portion of the mounting head.
Figure 4:
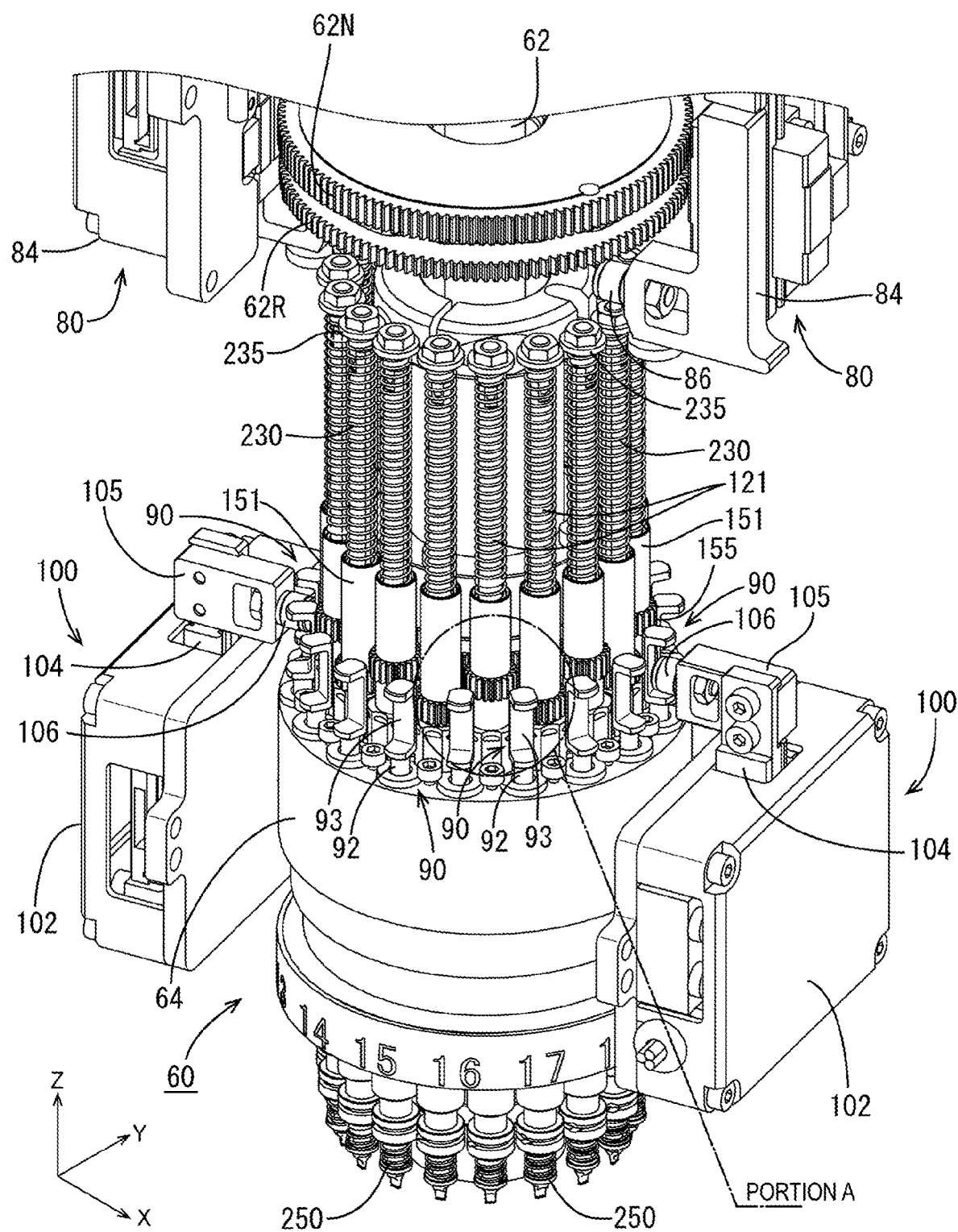
FIG. 4 is a perspective view illustrating a structure of a rotary body.

Next, the structure of the mounting head 50 is described in detail. The mounting head 50 is configured to hold the electronic component E1 fed by the feeder 42 by suction and mount the electronic component E1 on the printed circuit board B1. As illustrated in FIG. 2 to FIG. 4, the mounting head 50 of this embodiment includes a head body 60, a head supporting member 52 supporting the head body 60, and covers 53 and 54.

Figure 6:
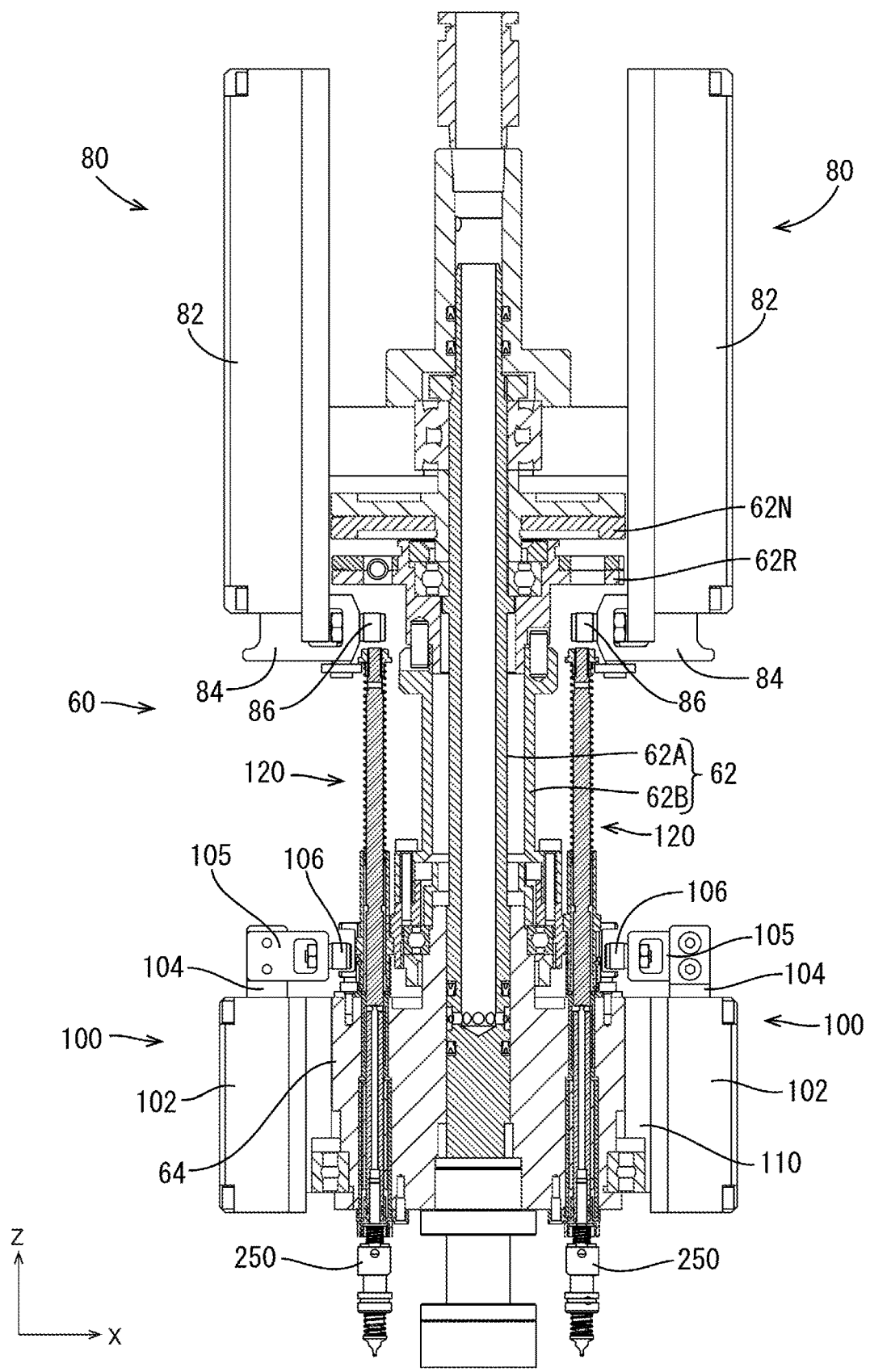
FIG. 6 is a cross-sectional view of main components of the mounting head.

As illustrated in FIG. 4 and FIG. 6, the head body 60, which is a rotary type head body, includes a shaft 62 having a cylindrical shape extending in the Z direction, a rotary body (corresponding to a "base" of this disclosure) 64, eighteen mounting shaft devices 120, and an N-axis drive unit 45.

The shaft 62 has a two-layered structure and includes an outer shaft 62B and an inner shaft 62A located inwardly from the outer shaft 62B. The inner shaft 62A is supported by the head supporting member 52 in a rotatable manner about the axis of the shaft 62A.

The rotary body 64 has a substantially cylindrical shape and has a larger diameter than the shaft 62. The rotary body 64 is fixed to the lower portion of the inner shaft 62A. The rotary body 64 has eighteen through holes 65. The eighteen through holes 65 are arranged in the circumferential direction with an equal distance therebetween. The mounting shaft devices 120 are attached to the respective through holes 65.

At the upper portion of the shaft 62, an N-axis driven gear 62N and an R-axis driven gear 62R are arranged one above the other (see FIG. 4). The N-axis driven gear 62N and the R-axis driven gear 62R are respectively engaged with the inner shaft 62A and the outer shaft 62B.

The N-axis drive unit 45 includes an N-axis servomotor 35N and an N-axis driving gear (not illustrated) disposed around the output shaft of the N-axis servomotor 35N. The N-axis driving gear and the N-axis driven gear 62N are engaged together. When the N-axis servomotor 35N is energized, a driving force of the motor 35N is transmitted to the inner shaft 62A through the N-axis driving gear and the N-axis driven gear 62N. This rotates the rotary body 64 together with the inner shaft 62A, and thus the eighteen mounting shaft devices 120 supported by the rotary body 64 are rotated together with the rotary body 64.

The outer shaft 62B is supported by the inner shaft 62A and the rotary body 64 at the axial end portions thereof via bearings. The outer shaft 62B is rotatable relative to the inner shaft 62A and the rotary body 64.

(Mounting Shaft Device)

As illustrated in FIG. 8 to FIG. 11, the mounting shaft device 120 includes a spline shaft 121, a ball retainer 141, a spline nut 151, which is an outer cylinder, a first shaft tube (corresponding to a "conduit" of the disclosure) 161, a second shaft tube (corresponding to a "support" of the disclosure) 171, a ball cage (a "bearing" of the disclosure) 181, and a coil spring 230.

The first shaft tube 161 has a tubular shape having a through hole extending in the Z direction (the up-down direction). The first shaft tube 161, which has a stepped configuration, includes a shaft body 162 having a small diameter and a housing portion 164 having a large diameter.

Figure 7:
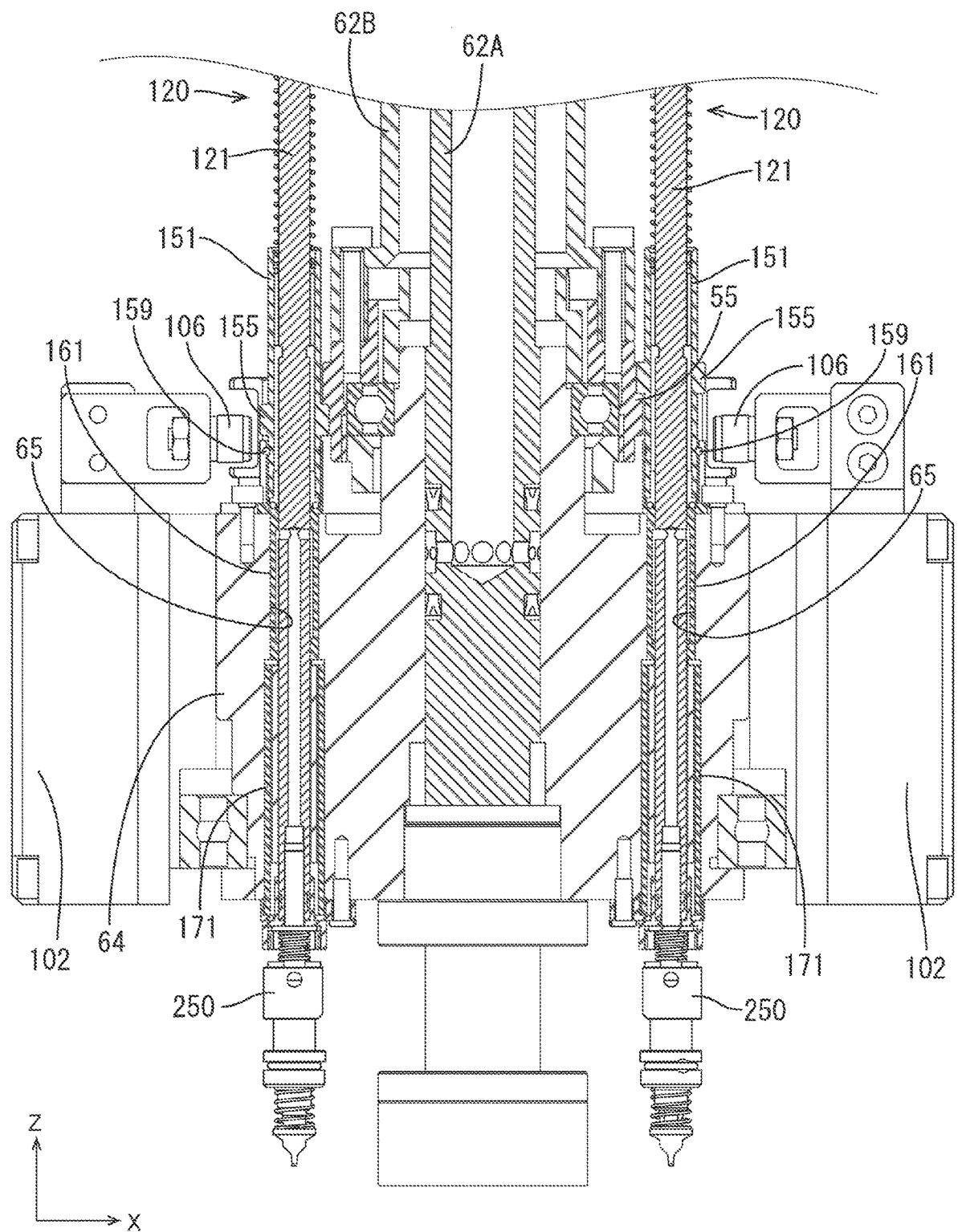
FIG. 7 is a magnified view of a portion (a lower half) in FIG. 6.

As illustrated in FIG. 7, the shaft body 162 of the first shaft tube 161 is located at the upper portion of the through hole 65 in the rotary body 64. The first shaft tube 161 is fixed to the through hole 65 in a non-rotatable manner.

The second shaft tube 171 has a tubular shape having a through hole extending in the Z direction (the up-down direction). As illustrated in FIG. 7, the second shaft tube 171 is located at the lower portion of the through hole 65 in the rotary body 64 and fixed to the through hole 65 in a non-rotatable manner. The end portion (the lower end portion) of the second shaft tube 171 protrudes from the lower surface of the rotary body 64.

Figure 8:
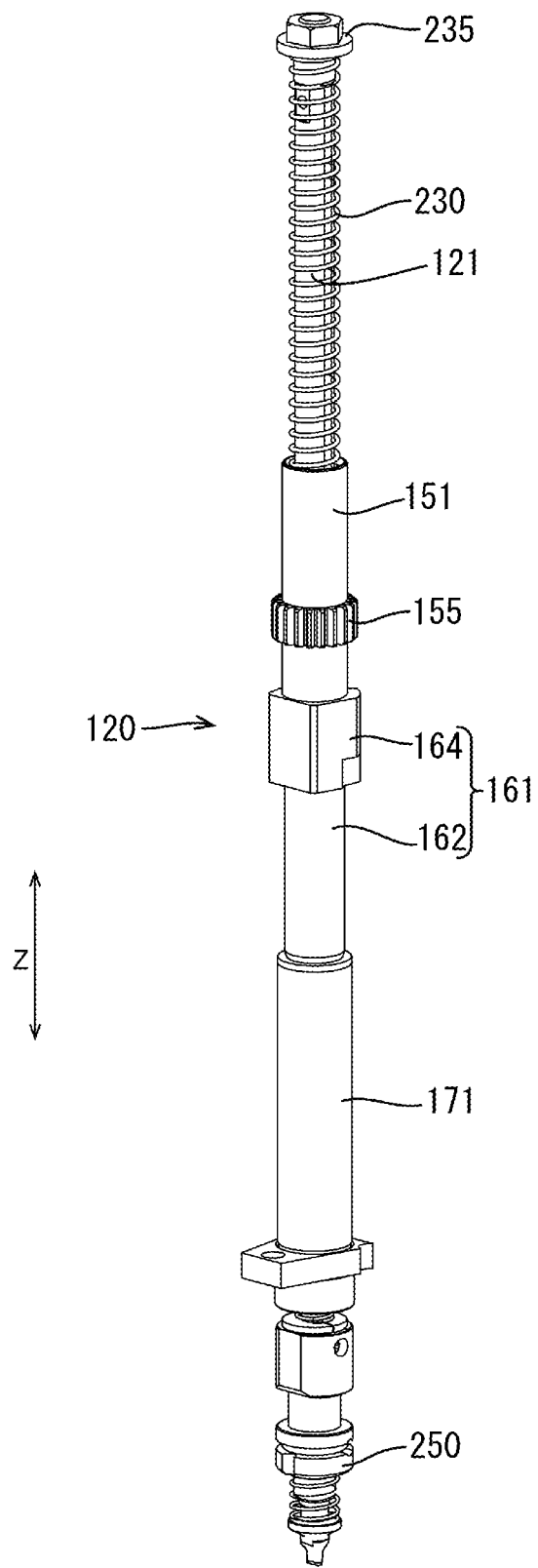
FIG. 8 is a perspective view of a mounting shaft device.
Figure 9:
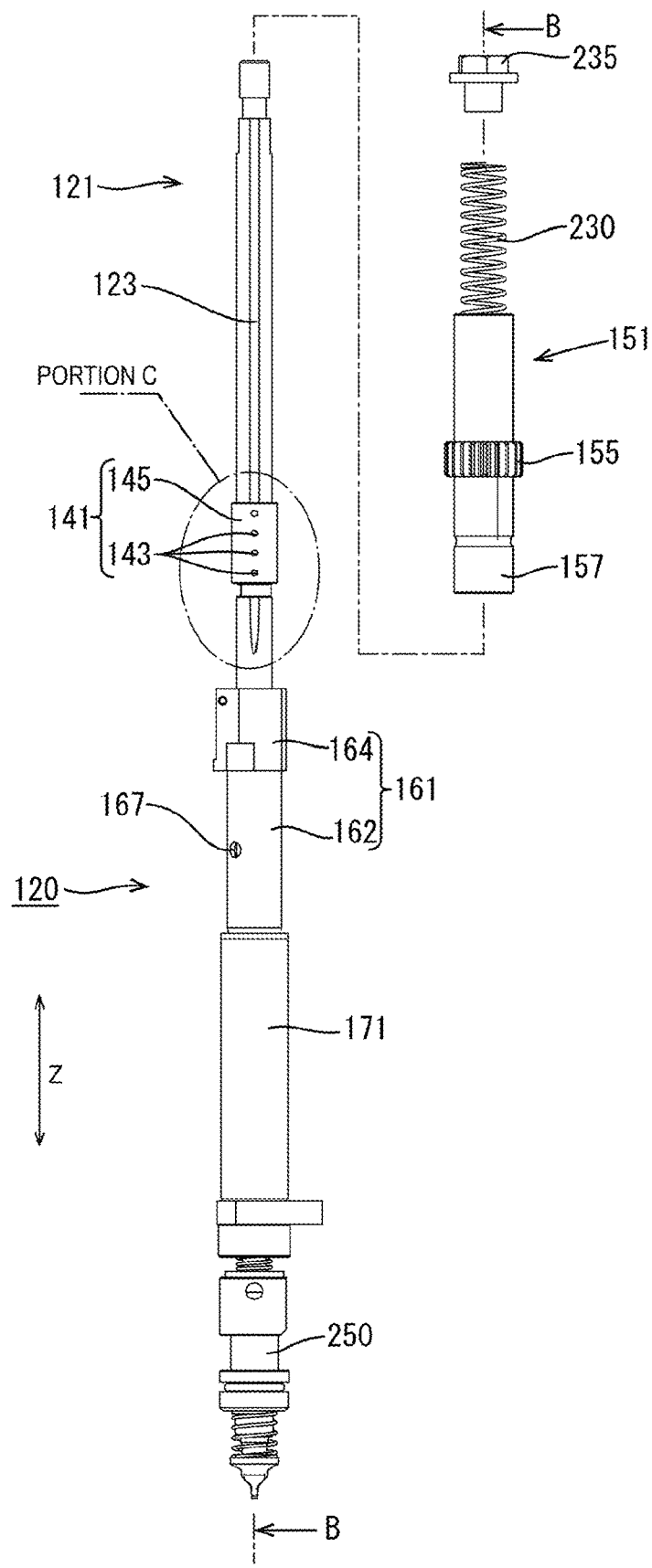
FIG. 9 is an exploded perspective view of the mounting shaft device.
Figure 10:
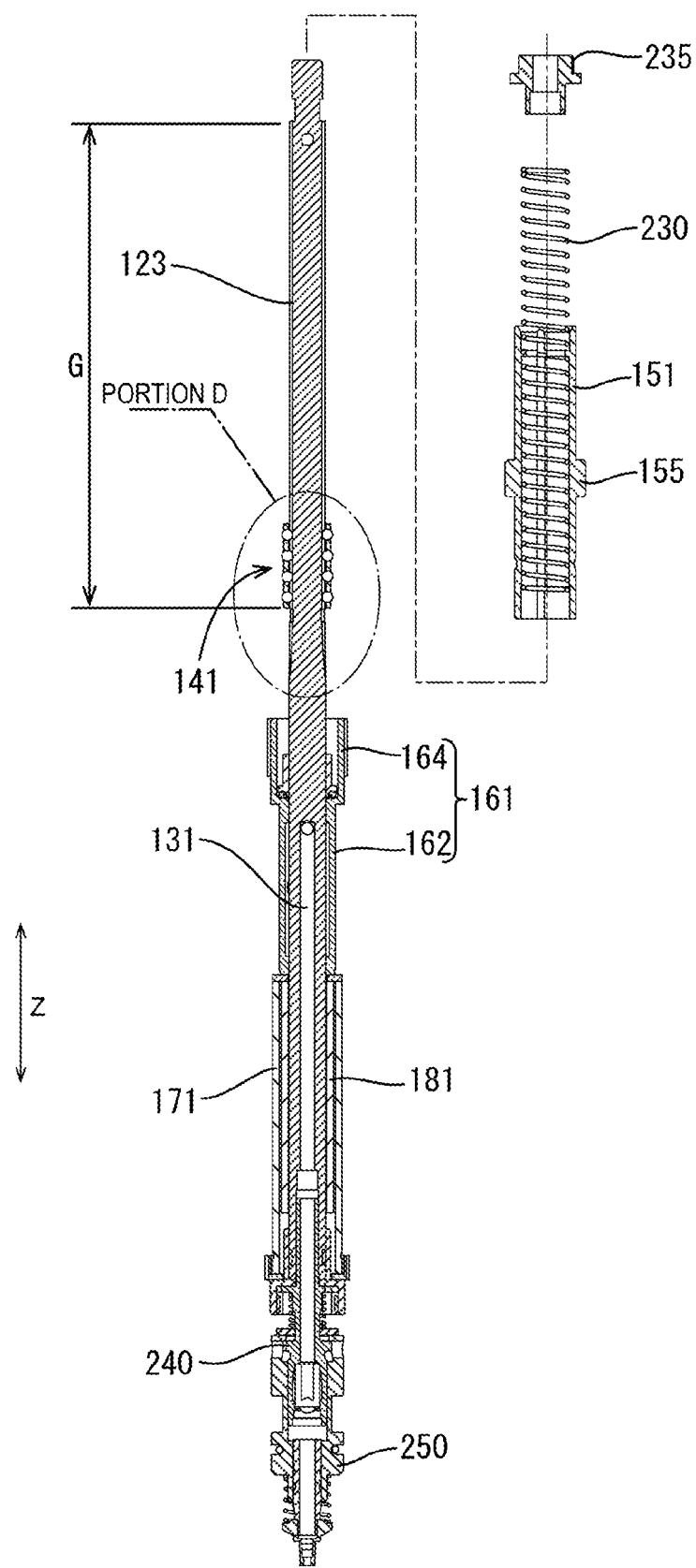
FIG. 10 is a cross-sectional view taken along line B-B in FIG. 9.
Figure 11:
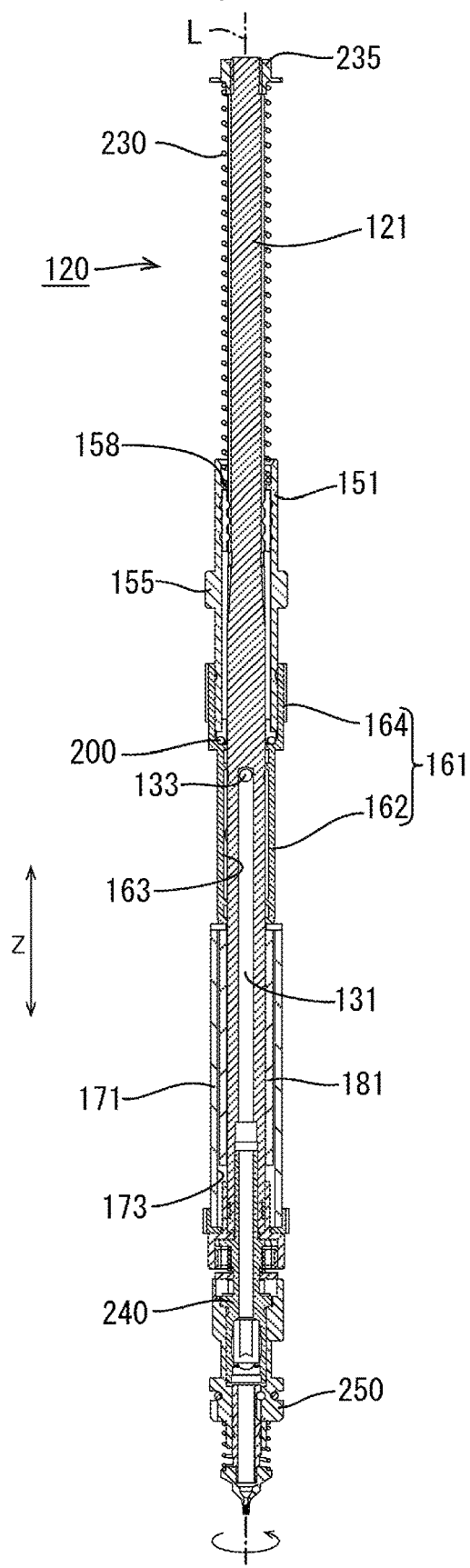
FIG. 11 is a cross-sectional view of the mounting shaft device.
Figure 12:
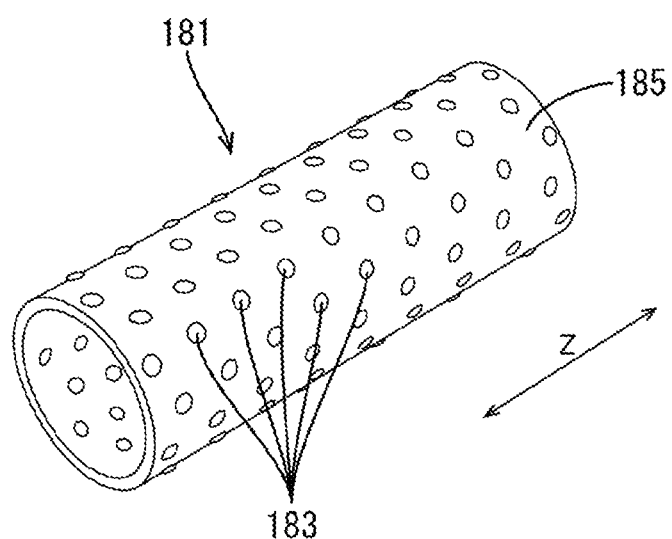
FIG. 12 is a perspective view of a ball cage.

As illustrated in FIG. 8 to FIG. 10, the spline shaft 121 is long in the Z direction (the up-down direction) and is a single shaft not separated in the Z direction. As illustrated in FIG. 11, the spline shaft 121 has a supply passage 131 extending in the Z direction at the core. The supply passage 131 extends in the spline shaft 121 over a lower region located slightly below the center of the spline shaft 121 in the Z direction.

The supply passage 131 extends to the lower end of the spline shaft 121 and in communication with the pickup nozzle 250 located at the axial end of the spline shaft 121. As described above, the supply passage 131 is included only in the lower portion of the spline shaft 121 and is not included in the upper portion thereof.

The spline shaft 121 further includes a through hole 133 and a ball groove 123. As illustrated in FIG. 11, the through hole 133 is located at the upper end of the supply passage 131. The through hole 133 extends through the core of the spline shaft 121 in the horizontal direction (in the radial direction) and in communication with the supply passage 131 located at the core.

As illustrated in FIG. 10, the ball groove 123 is provided on the upper portion of the spline shaft 121 and extends in the Z direction (the up-down direction). The ball groove 123 is not aligned with the supply passage 131 in the Z direction.

As illustrated in FIG. 7 and FIG. 11, the spline shaft 121 extends through a shaft hole 163 of the first shaft tube 161 and a shaft hole 173 of the second shaft tube 171, which are located one above the other, in this order. The spline shaft 121 is located in the first and second shaft tubes 161 and 171. The lower portion of the spline shaft 121 protrudes downward from the lower surface of the rotary body 64 and the upper portion thereof protrudes upward from the upper surface of the rotary body 64.

Figure 13:
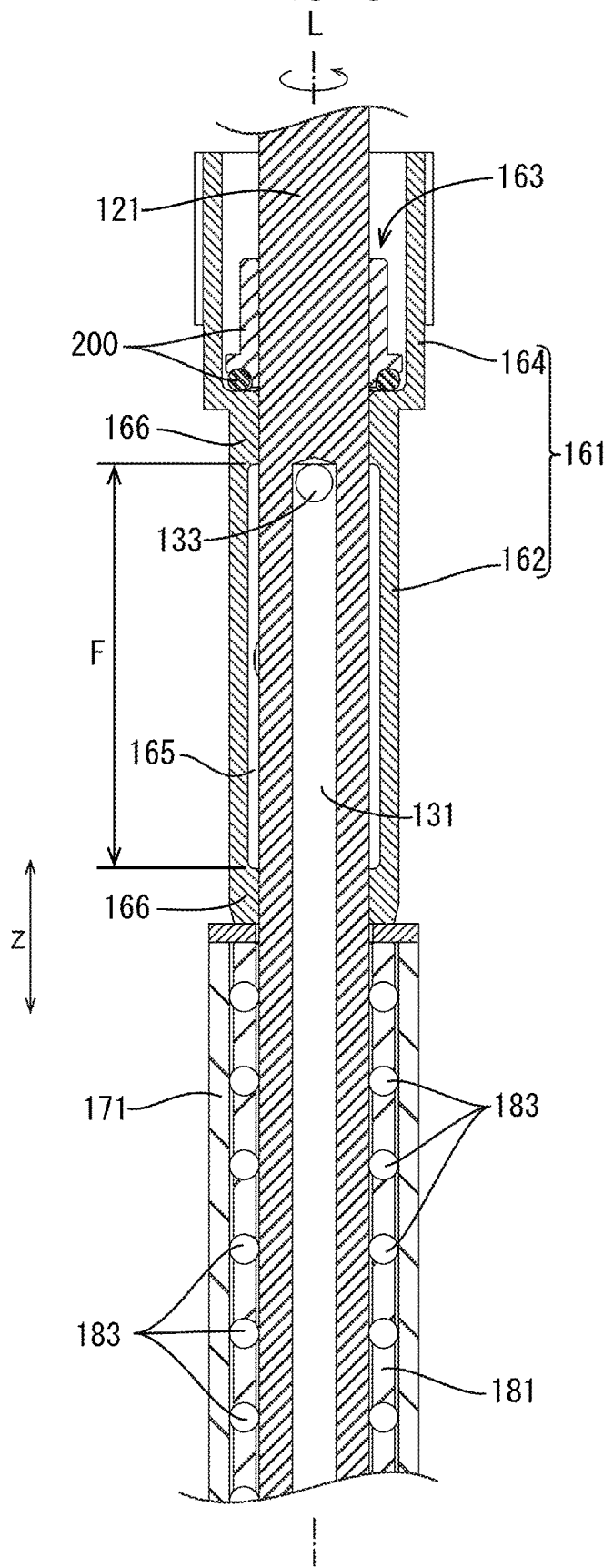
FIG. 13 is a magnified view of a portion in FIG. 10.

The ball cage 181 is located in the second shaft tube 171. As illustrated in FIG. 13, the ball cage 181 includes a plurality of balls 183 and a tubular retainer 185. The retainer 185 rollably retains the balls 183. More specifically described, the retainer 185 rollably retains the balls 183 arranged with an equal distance therebetween in the circumferential direction and arranged at a predetermined pitch in the Z direction.

The balls 183 retained by the retainer 185 are in contact with both the inner surface of the second shaft tube 171 and the outer surface of the spline shaft 121 to support the spline shaft 121. In other words, the balls 183 arranged with an equal distance therebetween in the circumferential direction are rolled in accordance with the rotation of the spline shaft 121 while being in contact with the inner surface of the second shaft tube 171 and the outer surface of the spline shaft 121. This allows the spline shaft 121 to be rotatably supported relative to the second shaft tube 171.

In addition, the balls 183 arranged in the Z direction are rolled in accordance with the linear movement of the spline shaft 121 in the Z direction (the axial direction) while being in contact with the inner surface of the second shaft tube 171 and the outer surface of the spline shaft 121. This allows the splines shaft 121 to be supported relative to the second shaft tube 171 in a linearly movable manner in the Z direction.

As described above, the ball cage 181 supports the spline shaft 121 relative to the second shaft tube 171 both in a rotatable manner about the axis L of the spline shaft 121 and in a linearly movable manner in the Z direction (the axial direction). Furthermore, the shaft body 162 of the first shaft tube 161 is in communication with a switching device (corresponding to a "valve" of the disclosure) 90 configured to switch air pressures to introduce the air pressure from the switching device 90 into the supply passage 131 of the spline shaft 121.

More specifically described, as illustrated in FIG. 13, the shaft body 162 and the spline shaft 121 define an air chamber 165 therebetween. The air chamber 165 extends over the entire circumference of the spline shaft 121. Sealing walls 166 in contact with the outer surface of the spline shaft 121 with no gap are disposed at the upper and lower ends of the air chamber 165 to prevent air in the air chamber 165 from escaping to the outside.

As illustrated in FIG. 13, the through hole 133 of the spline shaft 121 is located in the air chamber 165. The air chamber 165 is in communication with the supply passage 131 of the spline shaft 121 through the through hole 133.

The shaft body 162 has a communication hole 167 in the peripheral wall of the air chamber 165 (see FIG. 9). The communication hole 167 is in communication with an output port 94C of the switching device 90 through an inner passage 68 in the rotary body 64 (see FIG. 14). The air pressure from the switching device 90 is introduced to the air chamber 165 through the inner passage 68 and the communication hole 167. With this configuration, the air pressure from the switching device 90 is introduced to the supply passage 131 of the spline shaft 121 through the air chamber 165.

As illustrated in FIG. 13, the air chamber 165 has a predetermined dimension in the Z direction (indicated by "F" in FIG. 13), enabling the through hole 133 to be in the air chamber 165 when the spline shaft 121 moves in the Z direction in a predetermined range of movement. With this configuration, air pressure is applied from the switching device 90 to the supply passage 131 of the spline shaft 121 all the time even when the spline shaft 121 moves in the Z direction in a predetermined range of movement. In addition, since the air chamber 165 extends over the entire circumference of the spline shaft 121, air pressure is applied from the switching device 90 to the supply passage 131 of the spline shaft 121 all the time even when the spline shaft 121 rotates about its axis.

The position of the upper end of the supply passage 131 of the spline shaft 121 is determined depending on the position of the air chamber 165. More specifically described, the upper end of the supply passage 131 is flush with the upper end of the air chamber 165 when the spline shaft 121 is located at the upward movement end as illustrated in FIG. 6 and FIG. 13.

The housing portion 164 of the first shaft tube 161 is not located in the through hole 65 and is located above the upper surface of the rotary body 64. The housing portion 164 is configured to retain the spline nut 151.

As illustrated in FIG. 8 to FIG. 10, the spline nut 151 has a tubular shape having a through hole extending in the Z direction (an outer cylinder) and has a ball groove (not illustrated) extending in the up-down direction in the inner surface. A gear 155 is disposed on the outer surface of the spline nut 151.

The spline nut 151 is located coaxially with a portion of the spline shaft 121 protruding upward from the first shaft tube 161. The spline nut 151 has a lower portion 157 fitted in the housing portion 164 of the first shaft tube 161. The spline nut 151 is rotatably supported in the housing portion 164 of the first shaft tube 161 through a bearing 200. The spline nut 151 is prevented from coming off the housing portion 164 by a pin 159.

The ball retainer 141 is located between the spline shaft 121 and the spline nut 151. The ball retainer 141 includes a plurality of balls 143 arranged in a predetermined arrangement and a tubular retainer 145 rollably holding the balls 143.

The balls 143 arranged in lines partly fit in holes 145A in the retainer 145 in a rollable manner. The holes 145A are linearly arranged in the Z direction (the up-down direction) with a predetermined distance therebetween at a predetermined angle interval. The holes 145A in the retainer 145 each have a circular inner opening 145b having a diameter slightly smaller than the diameter of the ball 143. With this configuration, the balls 143 are supported by the retainer 145. The ball retainer 141 prevents the balls 143 from coming off the retainer 145 by itself. The linearly arranged balls 143 fit in both the ball groove 123 in the spline shaft 121 and the ball groove (not illustrated) in the spline nut 151.

The balls 183 are arranged not only on the front side of the spline shaft 121 as illustrated in FIG. 9, but are also arranged on the rear side, i.e., arranged in two lines in the actual configuration. Thus, the outer surface of the spline shaft 121 and the inner surface of the spline nut 151 each actually include two ball grooves.

The spline shaft 121 is connected to the spline nut 151 through a ball spline mechanism by the ball retainer 141, and thus rotational torque is transmitted to the spline shaft 121 through the spline nut 151. Furthermore, the spline shaft 121 is able to slide (linearly move) in the Z direction relative to the spline nut 151.

Furthermore, as illustrated in FIG. 7 and FIG. 11, a pickup nozzle (corresponding to a "component retainer" of the disclosure) 250, which is configured to hold an electronic component E1 by suction, is provided at a lower portion of each spline shaft 121 protruding downwardly from the rotary body 64 through a nozzle holder 240. A negative pressure or a positive pressure is applied to the pickup nozzle 250 through the supply passage 131. The pickup nozzles 250 are each configured to hold an electronic component E1 by suction at the end portion by means of a negative pressure and to release the electronic component E1, which is held at the end portion, by means of a positive pressure.

As illustrated in FIG. 8 to FIG. 10, the coil spring 230 is attached to the upper portion of the spline shaft 121. As illustrated in FIG. 11, the coil spring 230 is disposed between a spring retaining nut 235 attached to the upper end of the spline shaft 121 and a circular spring retaining plate 158 disposed on the inner surface of the upper portion of the spline nut 151.

The distance between the spring retaining plate 158 and the spring retaining nut 235 in the Z direction is largest when the spline shaft 121 is moved to the upward movement end as illustrated in FIG. 6. The coil spring 230 in such a state is still compressed and biases the spline shaft 121 in the upward direction all the time.

As illustrated in FIG. 11, the above-described mounting shaft device 120 includes, on the axis of the spline shaft 121, the ball cage 181, the first shaft tube 161, and the spline nut 151 in this order from the pickup nozzle 250, which is a component retainer (i.e., from the lower side in FIG. 11). In other words, the ball cage 181 configured to support the spline shaft 121 is closest to the pickup nozzle 250, which is configured to hold an electronic component by suction. This configuration improves mounting precision of an electronic component and reduces a response time required for switching of air pressures (time between switching of air pressures at the switching device and receiving of the air pressure at the pickup nozzle 250) is reduced.

Specifically described, displacement of the pickup nozzle 250 caused by tilting of the spline shaft 121 is substantially proportional to the distance between a supporting point on the spline shaft 121 and the pickup nozzle 250. Thus, displacement of the pickup nozzle 250 decreases as the distance between the ball cage 181, which supports the spline shaft 121, and the pickup nozzle 250 decreases. The above-described configuration improves mounting precision of an electronic component.

The response time required when the switching device 90 switches air pressures increases as the secondary volume of the switching device 90 increases. In this example, on the axis of the spline shaft 121, the ball cage 181, the first shaft tube 161, and the spline nut 151 are arranged in this order from the pickup nozzle 250. The first shaft tube 161 is closer than the spline nut 151 to the pickup nozzle 250.

With this arrangement, the length of the supply passage 131 in the spline shaft 121 is short compared with the case where the first shaft tube 161 and the spline nut 151 are conversely arranged. This reduces the secondary volume of the switching device 90, reducing a response time required for switching of air pressures performed by the switching device 90.

(R-Axis Drive Unit and Z-Axis Drive Unit)

As illustrated in FIG. 2 and FIG. 6, the mounting head 50 includes an R-axis drive unit 70 and two Z-axis drive units 80. The R-axis drive unit (corresponding to a "rotational driver" of the disclosure) 70 is configured to rotate the spline shafts 121 in the same direction about the axis L at the same time. The R-axis drive unit 70 includes an R-axis servomotor 35R (see FIG. 2), an R-axis driving gear 72R (see FIG. 3) disposed on the output shaft of the R-axis servomotor 35R and engaged with an R-axis driven gear 62R, and a common gear 55.

Figure 5:
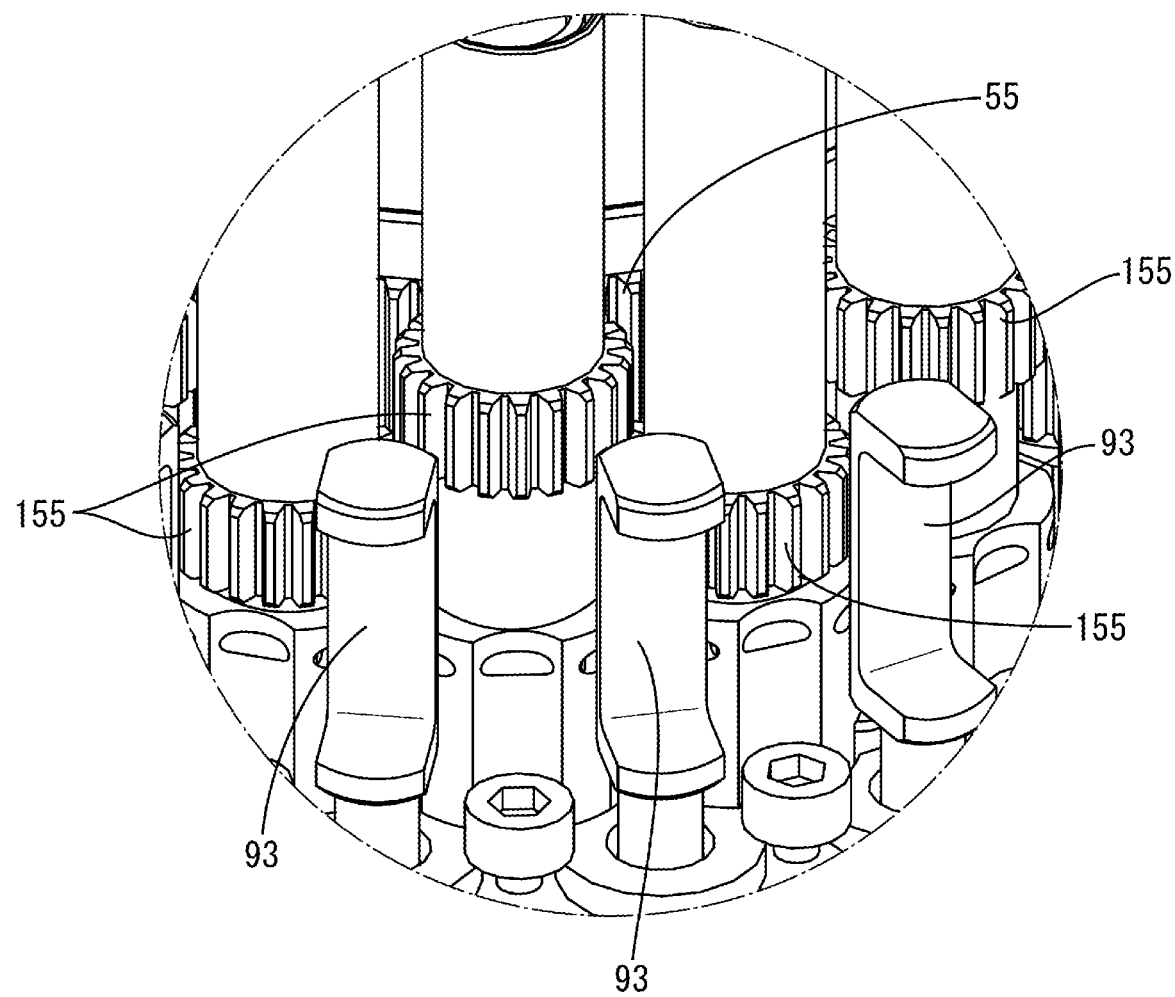
FIG. 5 is a magnified view of a portion A in FIG. 4.

The common gear 55 is disposed on the lower portion of the outer shaft 62B. As illustrated in FIG. 5, the common gear 55 is engaged with the gears 155 of the spline nuts 151. When the R-axis servomotor 35R is energized, a driving force of the motor 35R is transmitted to the outer shaft 62B and the common gear 55 through the R-axis driving gear 72R and the R-axis driven gear 62R, rotating the outer shaft 62B and the common gear 55.

The rotation of the common gear 55 rotates the spline nuts 151 due to the engagement of the common gear 55 with the gears 155. Then, since the spline nuts 151 are connected to the corresponding spline shafts 121 through a ball spline mechanism, the eighteen spline shafts 121 are rotated in the same direction about the respective axes by the same angle at the same time due to the rotation of the common gear 55.

The Z-axis drive units (corresponding to an "axial driver" of the disclosure) 80 are configured to move two of the eighteen spline shafts 121 located at predetermined positions (left and right sides in FIG. 6) up and down in the Z direction. The Z-axis drive units 80 are disposed symmetrically on the left and right sides of the head body 60 with the shaft 62 therebetween at positions above the spline shafts 121 (see FIG. 6).

As illustrated in FIG. 2, FIG. 4, and FIG. 6, the Z-axis drive units 80 each include a box-like body 82 and a Z-axis movable portion 84 configured to move in the Z direction (the up-down direction). A Z-axis linear motor (not illustrated) for driving the Z-axis movable portion 84 by a linear force is disposed in the body 82. As illustrated in FIG. 4 and FIG. 6, a Z-axis cam follower 86 is rotatably attached to the lower portion of each of the Z-axis movable portions 84.

When the Z-axis movable portion 84 is moved down from a default position illustrated in FIG. 6, the Z-axis cam follower 86 comes in contact with the upper end of the spline shaft 121 located at a predetermined position (left and right sides in FIG. 6) to move the spline shaft 121 downward against an elastic force of the coil spring 230. This moves the pickup nozzle 250 downward, allowing the end portion of the pickup nozzle 250 to come close to the printed circuit board B1 located at a component feeding position of the feeder 42 or the operation position. When the Z-axis movable portion 84 in this state is moved up, the spline shaft 121 and the pickup nozzle 250 are moved up by an elastic restoring force of the coil spring 230.

The Z-axis cam follower 86 at the default position illustrated in FIG. 6 is located away from the upper end of the spline shaft 121. Thus, when the Z-axis movable portions 84 are located at the default positions illustrated in FIG. 6, the entire rotary body including eighteen spline shafts 121 is able to rotate about the shaft 62 without coming in contact with the Z-axis cam follower 86.

(Switching Device and V-axis Drive Unit)

Figure 15:
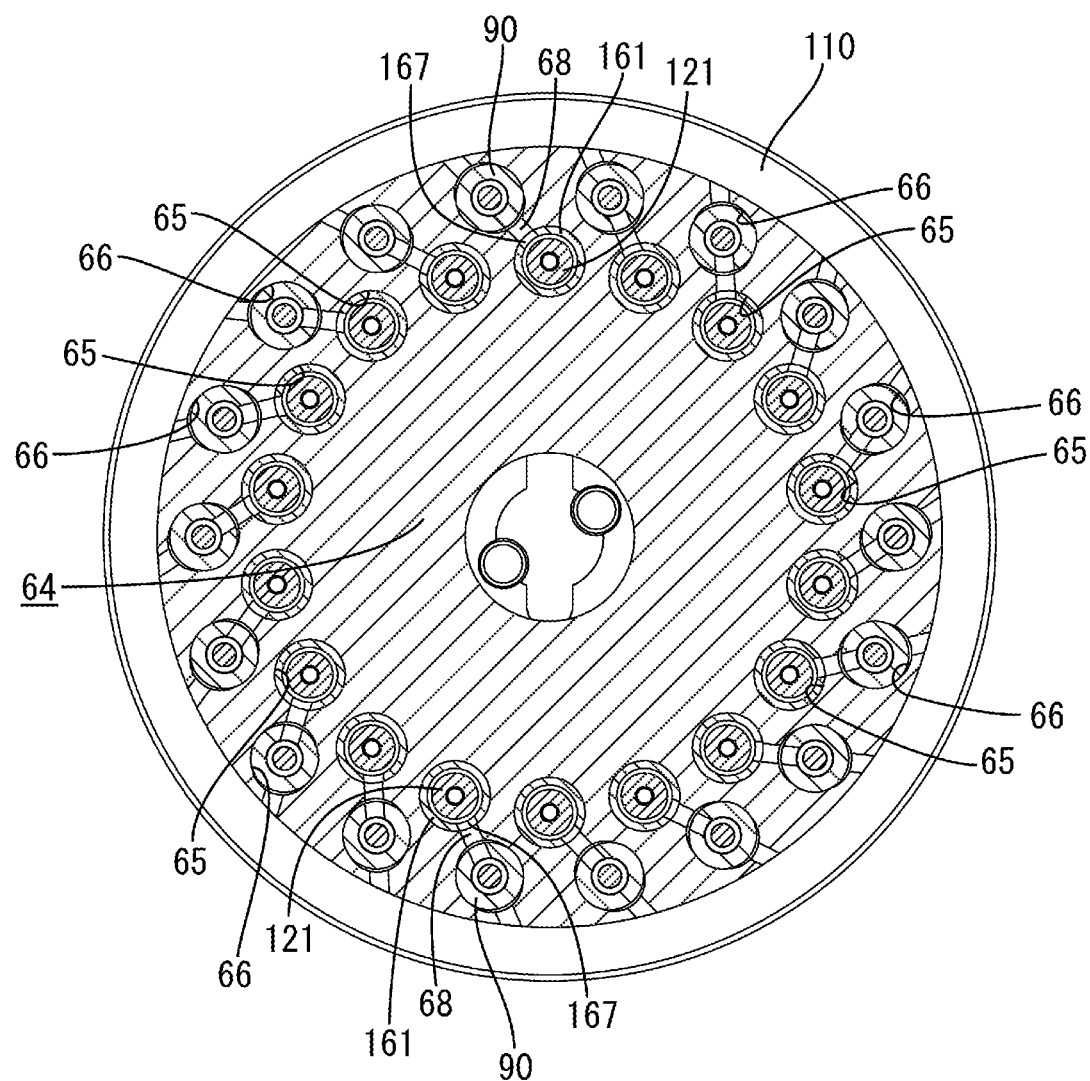
FIG. 15 is a cross-sectional view taken along line E-E in FIG. 14 (indicating positional relationship between a mounting head device and a switching device)

As illustrated in FIG. 4 and FIG. 6, the mounting head 50 includes switching devices 90 configured to switch the pressure applied to the pickup nozzles 250 between a negative pressure and a positive pressure and V-axis drive units 100 configured to activate the switching devices 90. Specifically described, as illustrated in FIG. 15, the rotary body 64 has eighteen mounting holes 66 with an equal distance therebetween in the circumferential direction. The mounting holes 66 are long in the Z direction and open in the upper surface of the rotary body 64. The switching devices 90 are disposed in the respective mounting holes 66, and thus eighteen switching devices 90 are disposed on the rotary body 64 with an equal distance therebetween in the circumferential direction.

As illustrated in FIG. 15, the mounting holes 66 are located adjacent to the corresponding through holes 65, in which the mounting shaft devices are disposed, on the outer sides of the through holes 65. Thus, the switching devices 90 are located adjacent to the corresponding mounting shaft devices 120 on the outer sides of the corresponding mounting shaft devices 120. More specifically described, the switching devices 90 are adjacent to the first shaft tubes 161 of the corresponding mounting shaft devices 120 on the outer sides of the first shaft tubes 161.

Figure 14:
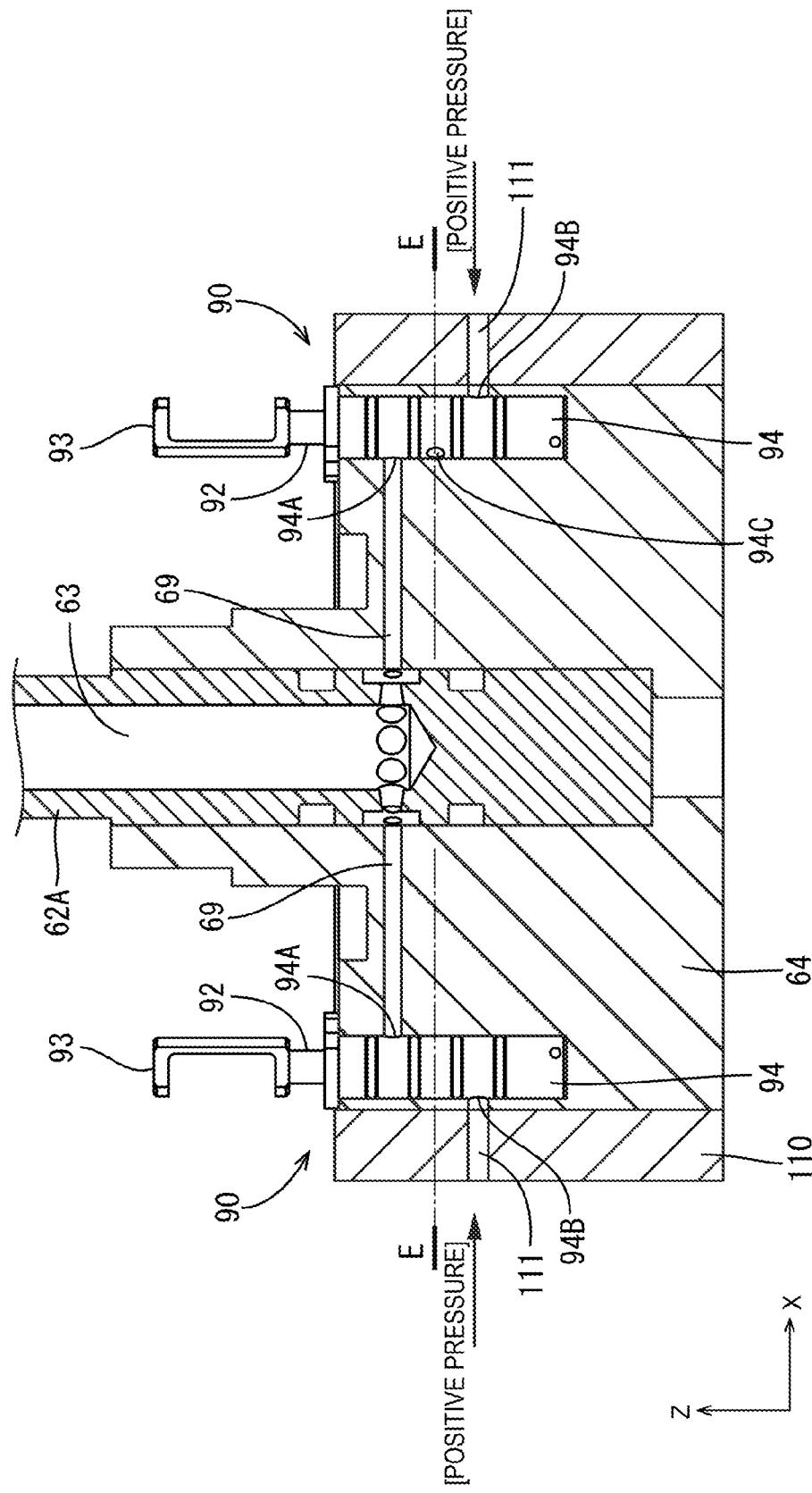
FIG. 14 is a vertical cross-sectional view of a rotary body.

As illustrated in FIG. 14, the switching devices 90 each include a valve spool 92 and a cylindrical sleeve 94. The valve spool 92 has a contact portion 93 having a laterally facing U-like shape at the upper portion. As illustrated in FIG. 14, the sleeve 94 has a negative pressure inlet port 94A, a positive pressure inlet port 94B, and an output port 94C.

As illustrated in FIG. 15, the output port 94C is connected to the communication hole 167 of the first shaft tube 161 of the corresponding mounting shaft device 120 through the inner passage 68 in the rotary body 64. Thus, the output port 94C is in communication with the air chamber 165 in the first shaft tube 161 through the inner passage 68 and the communication hole 167.

The valve spool 92 is configured to switch the flow paths in the sleeve 94 to change the port in communication with the output port 94C. In this example, when the valve spool 92 is located at the upward movement end (hereinafter, referred to as a "negative pressure application position"), the negative pressure inlet port 94A and the output port 94C are in communication with each other in the sleeve 94.

On the other hand, when the valve spool 92 is located at the downward movement end (hereinafter, referred to as a "positive pressure application position"), the positive pressure inlet port 94B and the output port 94C are in communication with each other. As described above, the pressure, which is applied to the pickup nozzle 250 through the inner passage 68, the communication hole 167, the air chamber 165, and the supply passage 131, is switched between a negative pressure and a positive pressure by movement of the valve spool 92.

To the negative pressure inlet port 94A of each switching device 90, a negative pressure is applied from a negative pressure source (not illustrated) through the negative pressure supply passage 63 in the inner shaft 62A and the negative pressure supply passage 69 in the rotary body 64. Furthermore, to the positive pressure inlet port 94B of each switching device 90, a positive pressure is applied from a positive pressure source (not illustrated) through the positive pressure supply passage 111 in an outer ring member 110 surrounding the outer surface of the rotary body 64. The rotary body 64 and the outer ring member 110 are rotatable relative to each other.

Next, the V-axis drive units 100 are described. The V-axis drive units 100 are each configured to move the valve spool 92 in the Z direction (the axial direction) between the negative pressure application position and the positive pressure application position. The V-axis drive units 100 are symmetrically arranged at the left and right sides of the mounting head 50 with the shaft 62 of the rotary body 60 therebetween in the same manner as the two Z-axis drive units 80.

The two V-axis drive units 100 are disposed at positions corresponding to the two Z-axis drive units 80 in the Z direction (see FIG. 6). The two V-axis drive units 100 are configured to move the valve spools 92 of the switching devices 90 corresponding to the pickup nozzles 250 of the mounting shaft devices 120 located at the predetermined positions (left and right sides in FIG. 6) between the negative pressure application position and the positive pressure application position.

As illustrated in FIG. 3, FIG. 4, and FIG. 6, the V-axis drive units 100 each include a body 102 having a box-like shape and a V-axis movable portion 104 configured to move in the Z direction (the up-down direction). A V-axis linear motor (not illustrated) is disposed in the body 102. As illustrated in FIG. 4 and FIG. 6, a cam follower 106 (hereinafter, referred to as a "V-axis cam follower 106") is rotatably attached to the V-axis movable portion 104 through a cam follower supporting portion 105.

When the V-axis cam follower 106 at the middle position is moved up by activation of the V-axis drive unit 100, the V-axis cam follower 106 pushes up the contact portion to move the valve spool 92 to the negative pressure application position. Contrary to this, when the V-axis cam follower 106 at the middle position is moved down, the V-axis cam follower 106 pushes down the contact portion to move the valve spool 92 to the positive pressure application position.

(How to Restrict Ball from Getting Stuck)

The spline shaft 121 needs to have the ball groove 123 for a spline mechanism. If the ball groove 123 is in the air chamber 165 in the first shaft tube 161, air in the air chamber 165 leaks to the outside through the ball groove 123. To prevent such leakage, the ball groove 123 needs to be away from the air chamber 165. In this example, the ball groove 123 is provided in a region indicated by "G" in FIG. 10.

Furthermore, the spline shaft 121 has a cut end portion 125 at the end of the ball groove 123. The cut end portion 125 is an incomplete groove. Specifically described, the cut end portion 125 is a groove having a depth gradually decreasing toward the distal end (the lower end in FIG. 18). The cut end portion 125 is formed when the ball groove 123 is formed only over a part of the spline shaft 121, not over the entire length of the spline shaft 121.

Figure 16:
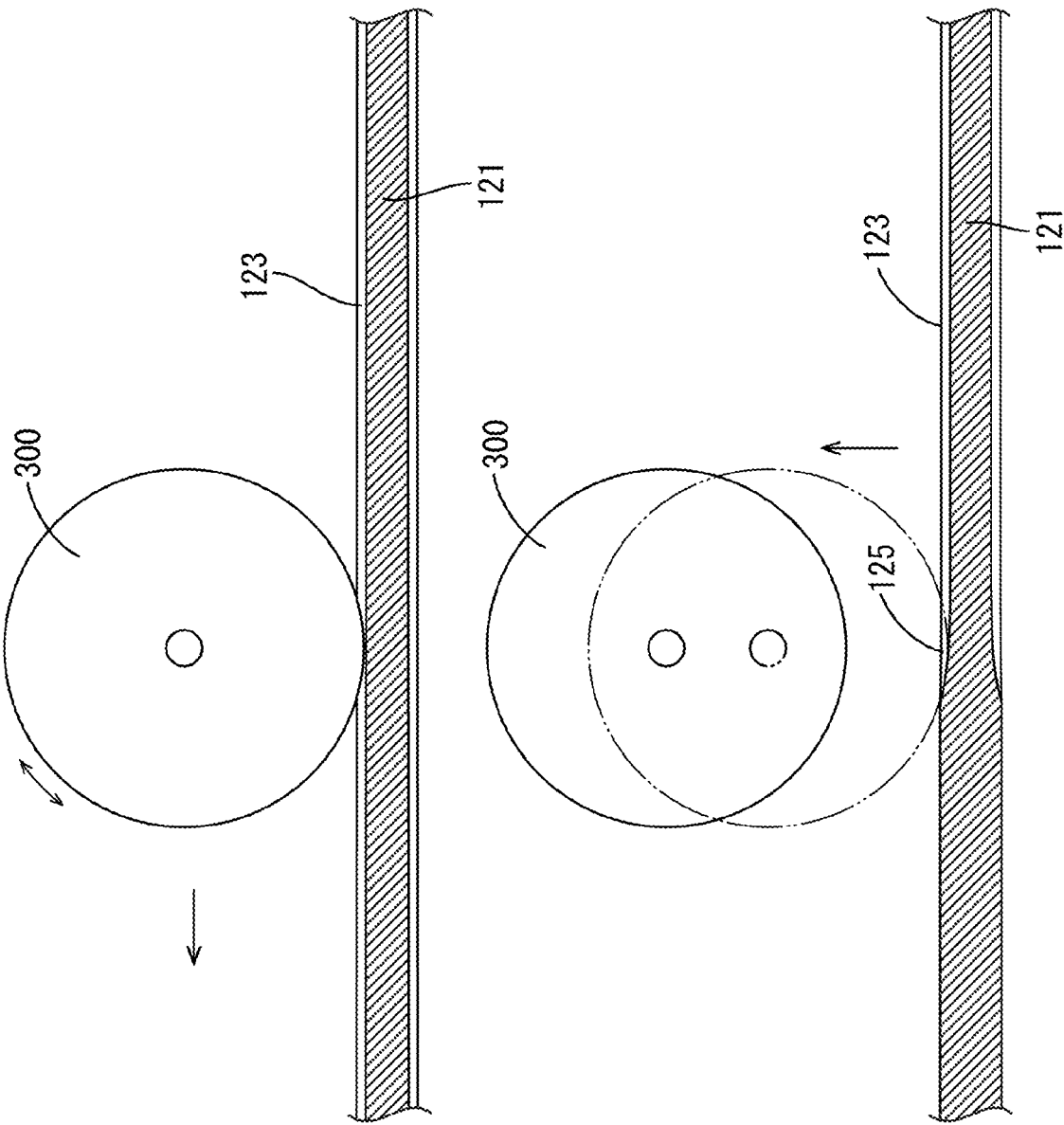
FIGS. 16A and 16B are views illustrating how the ball groove is formed.

More specifically described, as illustrated in FIGS. 16A and 16B, the ball groove 123 is formed by a cutting tool having a rotatable circular rotary blade 300. Thus, when the formation of the ball groove 123 is stopped before the ball groove 123 is formed over the entire length of the shaft 121, an unfinished or incomplete groove is formed at the end portion of the groove, i.e., the cut end portion 125 is formed. FIG. 16A illustrates an example in which the ball groove 123 is formed over the entire length of the spline shaft 121 (in which the cut end portion 125 is not formed). FIG. 16B illustrates an example in which the ball groove 123 is formed over a part of the spline shaft 121 (in which the cut end portion 125 is formed).

If the ball 143 enters the cut end portion 125, which has the gradually decreasing depth, the ball 143 would get stuck therein, leading to operational malfunction. The cut end portion 125 is one example of an "incomplete groove" of the disclosure.

Figure 17:
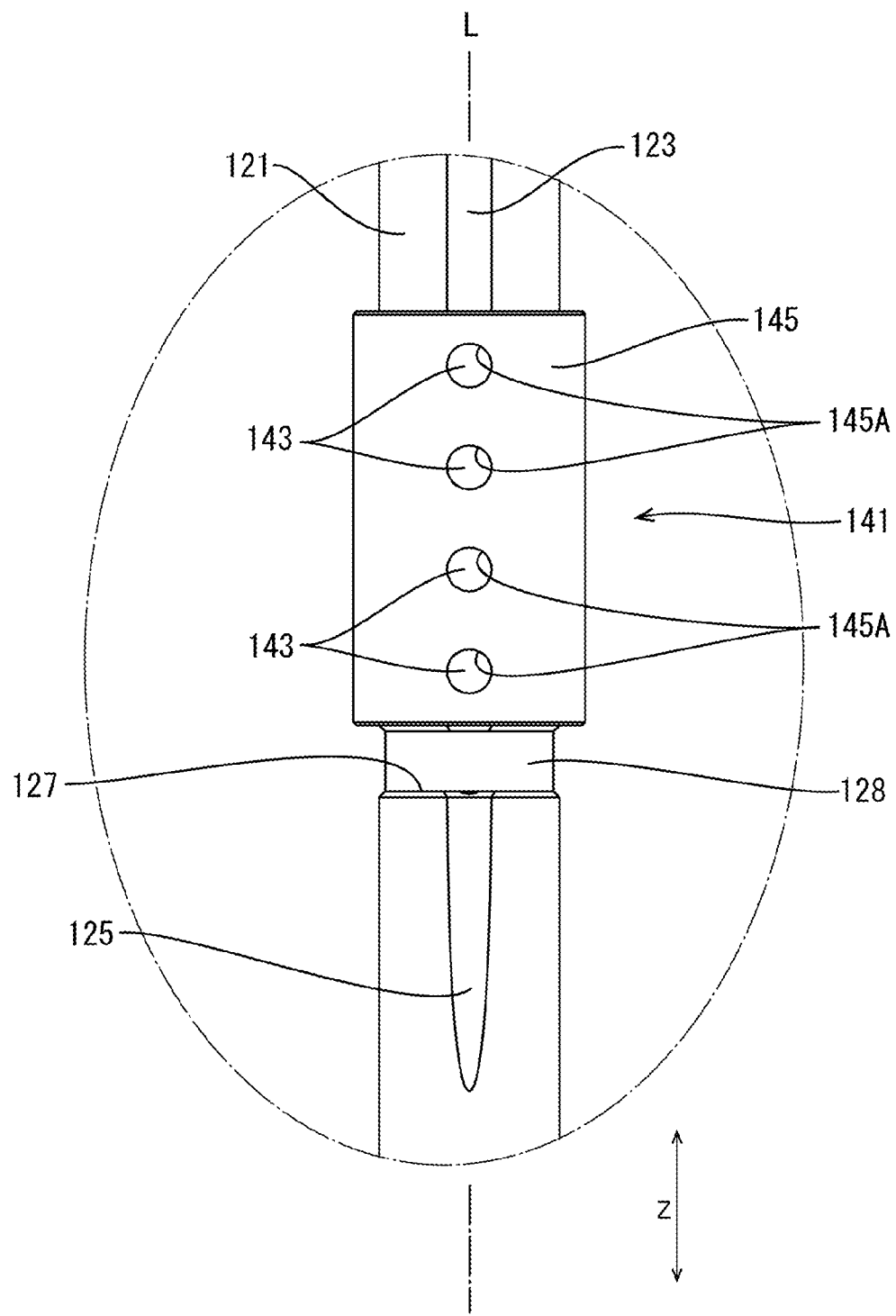
FIG. 17 is a magnified view of a portion C in FIG. 9.
Figure 18:
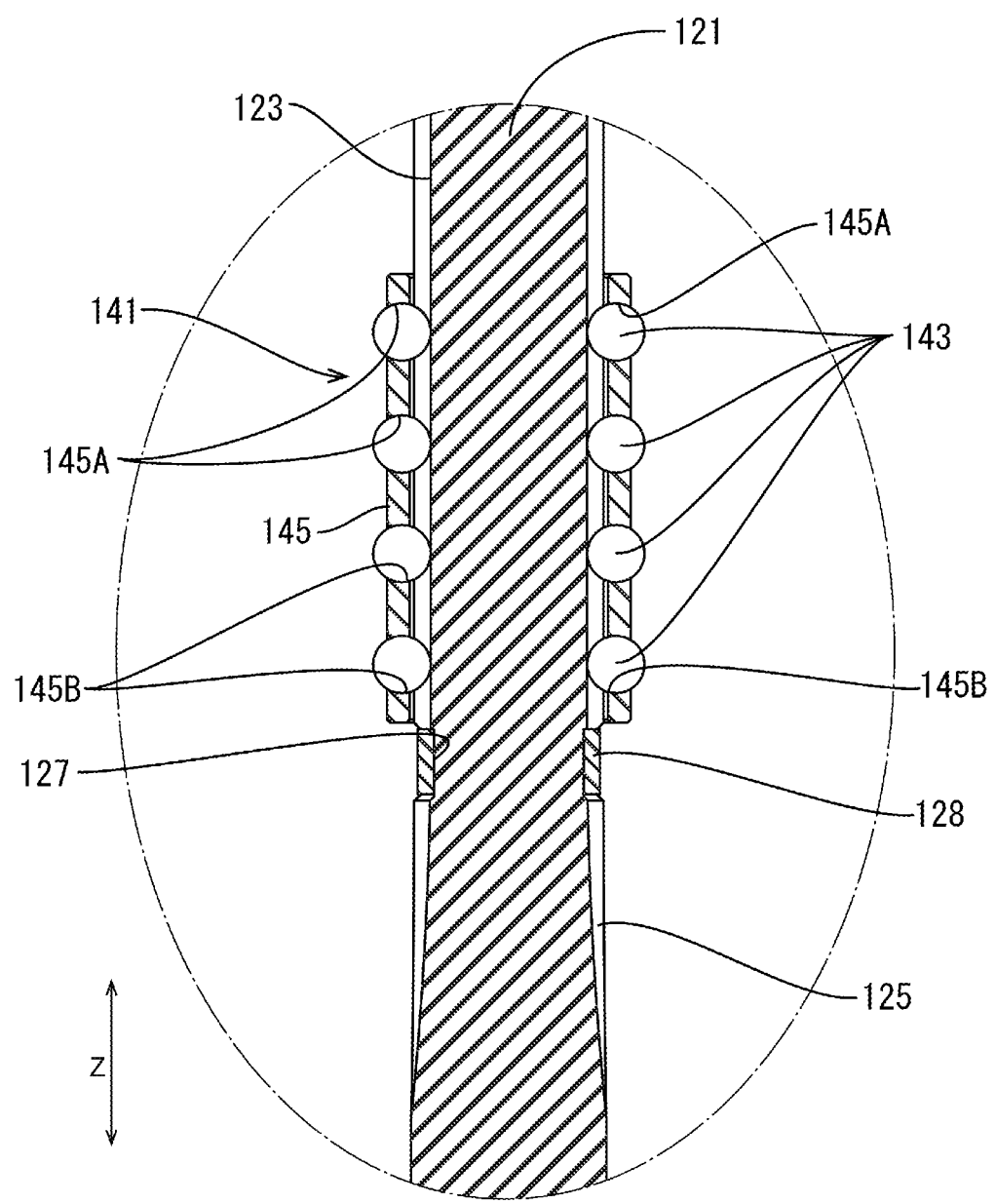
FIG. 18 is a magnified view of a portion D in FIG. 10.

In this embodiment, as illustrated in FIG. 17 and FIG. 18, the spline shaft 121 has an annular groove 127, and a ball stopper 128 is disposed in the annular groove 127. The annular groove 127 has an annular shape having the axial line L of the spline shaft 121 as the center. The annular groove 127 is located at a border between the cut end portion 125 and the ball groove (a full groove) 123.

The annular groove 127 is a groove deeper than the cut end portion 125, and thus a step is formed between the annular groove 127 and the cut end portion 125. The ball stopper (one example of a "restrictor" of the disclosure) 128, which is disposed in the annular groove 127, is an open ring-shaped resin member. The ball stopper 128 having an open ring shape is able to be attached to the annular groove 127 from the lateral side.

When the ball 143 rolls along the ball groove 123 to the end of the ball groove 123 (the lower end in FIG. 18), the ball 143 comes in contact with the ball stopper 128, which restricts the ball 143 in the ball groove 123 from moving into the cut end portion 125. Thus, the ball 143 is unlikely to get stuck in the cut end portion 125. This reduces operational malfunction of the spline shaft 121 in linear movement in the Z direction (the axial direction).

Furthermore, as illustrated in FIG. 18, the outer diameter of the ball stopper 128 is smaller than the outer diameter of the spline shaft 121. This configuration prevents the ball stopper 128 from coming in contact with the retainer 145 of the ball retainer 141.

Advantages of Embodiment

In the mounting shaft device 120 of the embodiment, on the axis of the spline shaft 121, the ball cage 181, the first shaft tube 161, and the spline nut 151 are arranged in this order from the pickup nozzle 250, which is a component retainer (i.e., from the lower side in FIG. 11). This configuration improves mounting precision of an electronic component and reduces a response time required for switching of air pressures.

Other Embodiments

The technology disclosed herein is not limited to the embodiment described above and illustrated by the drawings. For example, the following embodiments will be included in the technical scope.

(1) In the above-described embodiment, a rotary type mounting head including the mounting shaft devices 120 arranged in the circumferential direction is described as one example of the mounting head. However, the mounting head may be an in-line type mounting head having the mounting shaft devices 120 arranged in a straight line in one axial direction, for example. Furthermore, the mounting head may include only one mounting shaft device 120, not a plurality of mounting shaft devices 120.

(2) In the above-described embodiment, the pickup nozzle 250 is described as one example of a component retainer, but the component retainer may be a chuck type component retainer configured to be opened or closed by using air pressure.

Figure 19:
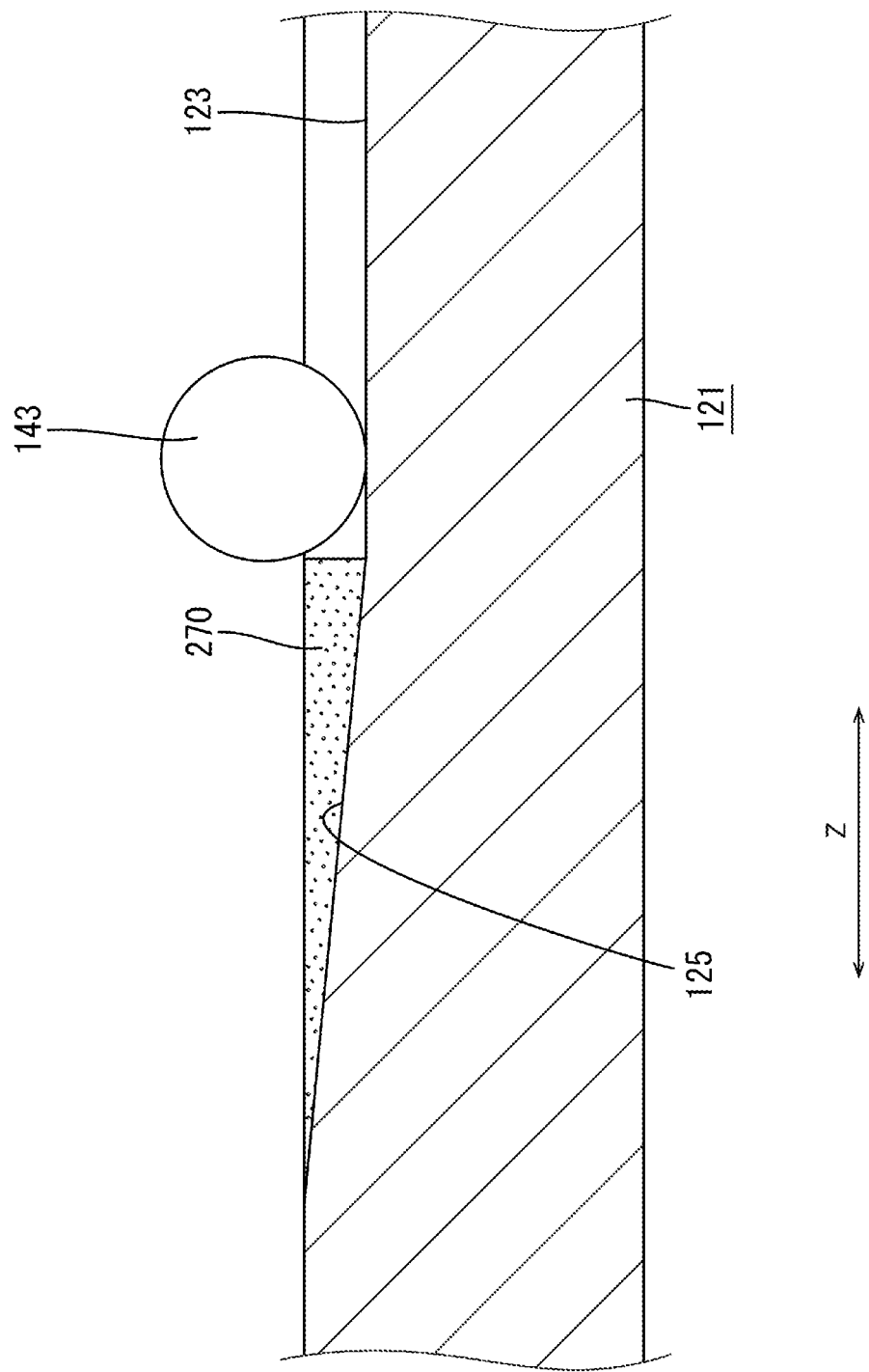
FIG. 19 is a cross-sectional view illustrating another embodiment of a spline shaft.

(3) In the example of the above-described embodiment, the ball stopper 128 is employed to restrict the ball 143 from getting stuck in the cut end portion 125 of the spline shaft 121. However, a filler 270 (see FIG. 19) formed of resin, for example, may fill the cut end portion 125 to restrict the ball 143 from getting stuck in the cut end portion 125.

(4) In the example of the above-described embodiment, the ball stopper 128 has an open ring shape. However, the ball stopper 128 may have a closed ring shape not having an opening. In such a case, the ball stopper 128 may be attached to the annular groove 127 from the axial end of the spline shaft 121. Furthermore, the material of the ball stopper 128 is not limited to resin and may be rubber, for example.

(5) In the example of the above-described embodiment, the ball stopper 128 is employed to restrict the ball 143 from getting stuck in the cut end portion 125 of the spline shaft 121. However, as illustrated in FIG. 20, a step 280 at a border between the cut end portion 125 and the ball groove 123 may be used to restrict the ball 143 from getting stuck in the cut end portion 125 of the spline shaft 121.

FIG. 20 illustrates an example in which the step 280 is employed to restrict the ball 143 from getting stuck in the cut end portion 125. The step 280 continuously extends from the cut end portion 125 to the ball groove 123. When the ball 143 comes in contact with the step 280, the ball 143 in the ball groove 123 is restricted from moving into the cut end portion 125.

(6) In the above-described embodiment, the second shaft tube 171 is described as one example of the support. However, the rotary body 64 may be a support, for example. Specifically described, the second shaft tube 171 may be eliminated, and the spline shaft 121 may be supported in the through hole 65 of the rotary body 64. If the second shaft tube 171 is eliminated, the ball cage 181 may be disposed between the through hole 65 in the rotary body 64 and the spline shaft 121 to support the spline shaft 181.

What is claimed is:

1. A mounting shaft device configured to mount an electronic component, the mounting shaft device comprising:
    a spline shaft including a supply passage for air pressure therein and extending through a shaft hole in a support;
    a conduit in communication with a valve and allowing the air pressure from the valve to be introduced to the supply passage of the spline shaft;
    a component retainer located at an axial end of the spline shaft and configured to receive the air pressure through the supply passage of the spline shaft to hold an electronic component;
    a spline nut connected to the spline shaft through a spline mechanism; and
    a bearing supporting the spline shaft in the shaft hole in the support both in a linearly movable manner in an axial direction and in a rotatable manner about an axis thereof,
    wherein
    the spline shaft is freely rotatable around the axis thereof with respect to the conduit and the support;
    the bearing, the conduit, and the spline nut are arranged on an axis of the spline shaft in this order from the component retainer;
    the spline shaft has a ball groove extending in an axial direction of the spline shaft and receiving a ball connecting the spline shaft and the spline nut to each other through a spline mechanism, and
    the ball groove is provided only on an upper portion of the spline shaft where the spline nut is disposed and is not provided on a portion corresponding to the conduit and a portion corresponding to the bearing located below the spline nut.

2. The mounting shaft device according to claim 1, wherein
    the conduit has a tubular shape, the conduit and the spline shaft defining an air chamber in communication with the supply passage therebetween, and
    the conduit has a communication hole in a peripheral wall of the air chamber, the communication hole being in communication with the valve.

3. The mounting shaft device according to claim 2, wherein the spline shaft has the ball groove and a restrictor at an end portion of the ball groove, the restrictor being configured to restrict the ball from getting stuck in an incomplete groove having a depth gradually decreasing toward a distal end.

4. The mounting shaft device according to claim 3, wherein the restrictor is a step at the border between the incomplete groove and the ball groove.

5. The mounting shaft device according to claim 3, wherein the restrictor is a filler filling the incomplete groove.

6. The mounting shaft device according to claim 1, wherein the spline shaft has the ball groove and a restrictor at an end portion of the ball groove, the restrictor being configured to restrict the ball from getting stuck in an incomplete groove having a depth gradually decreasing toward a distal end.

7. The mounting shaft device according to claim 6, wherein the restrictor is a step at the border between the incomplete groove and the ball groove.

8. The mounting shaft device according to claim 6, wherein the restrictor is a filler filling the incomplete groove.

9. The mounting shaft device according to claim 1, wherein an outer peripheral surface of the spline shaft is away from an inner peripheral surface of the conduit and an inner peripheral surface of the support.

10. A mounting shaft device configured to mount an electronic component, the mounting shaft device comprising:
    a spline shaft including a supply passage for air pressure therein and extending through a shaft hole in a support;
    a conduit in communication with a valve and allowing the air pressure from the valve to be introduced to the supply passage of the spline shaft;
    a component retainer located at an axial end of the spline shaft and configured to receive the air pressure through the supply passage of the spline shaft to hold an electronic component;
    a spline nut connected to the spline shaft through a spline mechanism; and a bearing supporting the spline shaft in the shaft hole in the support both in a linearly movable manner in an axial direction and in a rotatable manner about an axis thereof, wherein the bearing, the conduit, and the spline nut are arranged on an axis of the spline shaft in this order from the component retainer;

the spline shaft has a ball groove extending in an axial direction of the spline shaft and receiving a ball connecting the spline shaft and the spline nut to each other through a spline mechanism, and the ball groove is provided only on an upper portion of the spline shaft where the spline nut is disposed and is not provided on a portion corresponding to the conduit and a portion corresponding to the bearing located below the spline nut, the spline shaft has the ball groove and a restrictor at an end portion of the ball groove, the restrictor being configured to restrict the ball from getting stuck in an incomplete groove having a depth gradually decreasing toward a distal end, the spline shaft has an annular groove having an annular shape at a border between the incomplete groove and the ball groove, and the restrictor is a ball stopper disposed in the annular groove at the border between the incomplete groove and the ball groove, the ball stopper being configured to restrict the ball in the ball groove from moving into the incomplete groove.

11. A mounting head comprising:

a mounting shaft device configured to mount an electronic component, the mounting shaft device comprising:

a spline shaft including a supply passage for air pressure therein and extending through a shaft hole in a support;

a conduit in communication with a valve and allowing the air pressure from the valve to be introduced to the supply passage of the spline shaft;

a component retainer located at an axial end of the spline shaft and configured to receive the air pressure through the supply passage of the spline shaft to hold an electronic component;

a spline nut connected to the spline shaft through a spline mechanism; and a bearing supporting the spline shaft in the shaft hole in the support both in a linearly movable manner in an axial direction and in a rotatable manner about an axis thereof, wherein the spline shaft is freely rotatable around the axis thereof with respect to the conduit and the support, the bearing, the conduit, and the spline nut are arranged on an axis of the spline shaft in this order from the component retainer, the spline shaft has a ball groove extending in an axial direction of the spline shaft and receiving a ball connecting the spline shaft and the spline nut to each other through a spline mechanism, and the ball groove is provided only on an upper portion of the spline shaft where the spline nut is disposed and is not provided on a portion corresponding to the conduit and a portion corresponding to the bearing located below the spline nut;

a base having a through hole in which the conduit and the support are disposed one above the other and through which the spline shaft extends in the axial direction;

the valve in a mounting hole in the base and in communication with the conduit;

an axial driver connected to the spline shaft to move the spline shaft in the axial direction; and a rotational driver connected to the spline nut to transmit torque to the spline nut to rotate the spline shaft about an axis thereof.

12. A mounting head according to claim 11, wherein the conduit has a tubular shape, the conduit and the spline shaft defining an air chamber in communication with the supply passage therebetween, and the conduit has a communication hole in a peripheral wall of the air chamber, the communication hole being in communication with the valve.

13. A mounting head according to claim 11, wherein the spline shaft has the ball groove and a restrictor at an end portion of the ball groove, the restrictor being configured to restrict the ball from getting stuck in an incomplete groove having a depth gradually decreasing toward a distal end.

14. A mounting head according to claim 13, wherein the restrictor is a step at the border between the incomplete groove and the ball groove.

15. A mounting head according to claim 13, wherein the restrictor is a filler filling the incomplete groove.

16. A surface mounter comprising a mounting shaft device configured to mount an electronic component, the mounting shaft device comprising:

a spline shaft including a supply passage for air pressure therein and extending through a shaft hole in a support;

a conduit in communication with a valve and allowing the air pressure from the valve to be introduced to the supply passage of the spline shaft;

a component retainer located at an axial end of the spline shaft and configured to receive the air pressure through the supply passage of the spline shaft to hold an electronic component;

a spline nut connected to the spline shaft through a spline mechanism; and a bearing supporting the spline shaft in the shaft hole in the support both in a linearly movable manner in an axial direction and in a rotatable manner about an axis thereof, wherein the spline shaft is freely rotatable around the axis thereof with respect to the conduit and the support, the bearing, the conduit, and the spline nut are arranged on an axis of the spline shaft in this order from the component retainer, the spline shaft has a ball groove extending in an axial direction of the spline shaft and receiving a ball connecting the spline shaft and the spline nut to each other through a spline mechanism, and the ball groove is provided only on an upper portion of the spline shaft where the spline nut is disposed and is not provided on a portion corresponding to the conduit and a portion corresponding to the bearing located below the spline nut;

a base having a through hole in which the conduit and the support are disposed one above the other and through which the spline shaft extends in the axial direction;

the valve in a mounting hole in the base and in communication with the conduit;
an axial driver connected to the spline shaft to move the spline shaft in the axial direction; and
a rotational driver connected to the spline nut to transmit torque to the spline nut to rotate the spline shaft about an axis thereof,
wherein the surface mounter is configured to mount an electronic component held by the component retainer of the mounting head onto a board.

17. A surface mounter according to claim 16, wherein
the conduit has a tubular shape, the conduit and the spline shaft defining an air chamber in communication with the supply passage therebetween, and
the conduit has a communication hole in a peripheral wall of the air chamber, the communication hole being in communication with the valve.

18. A mounting shaft device configured to mount an electronic component, the mounting shaft device comprising;
a spline shaft including a supply passage for air pressure therein and extending through a shaft hole in a support;
a conduit in communication with a valve and allowing the air pressure from the valve to be introduced to the supply passage of the spline shaft;
a component retainer located at an axial end of the spline shaft and configured to receive the air pressure through the supply passage of the spline shaft to hold an electronic component;
a spline nut connected to the spline shaft through a spline mechanism; and
a bearing supporting the spline shaft in the shaft hole in the support both in a linearly movable manner in an axial direction and in a rotatable manner about an axis thereof,
wherein
the bearing, the conduit, and the spline nut are arranged on an axis of the spline shaft in this order from the component retainer;
the spline shaft has a ball groove extending in an axial direction of the spline shaft and receiving a ball connecting the spline shaft and the spline nut to each other through a spline mechanism, and
the ball groove is provided only on an upper portion of the spline shaft where the spline nut is disposed and is not provided on a portion corresponding to the conduit and a portion corresponding to the bearing located below the spline nut,
the conduit has a tubular shape, the conduit and the spline shaft defining an air chamber in communication with the supply passage therebetween, and
the conduit has a communication hole in a peripheral wall of the air chamber, the communication hole being in communication with the valve,
the spline shaft has the ball groove and a restrictor at an end portion of the ball groove, the restrictor being configured to restrict the ball from getting stuck in an incomplete groove having a depth gradually decreasing toward a distal end,
the spline shaft has an annular groove having an annular shape at a border between the incomplete groove and the ball groove, and
the restrictor is a ball stopper disposed in the annular groove at the border between the incomplete groove and the ball groove, the ball stopper being configured to restrict the ball in the ball groove from moving into the incomplete groove.

19. A mounting head comprising:
a mounting shaft device configured to mount an electronic component, the mounting shaft device comprising:
a spline shaft including a supply passage for air pressure therein and extending through a shaft hole in a support;
a conduit in communication with a valve and allowing the air pressure from the valve to be introduced to the supply passage of the spline shaft;
a component retainer located at an axial end of the spline shaft and configured to receive the air pressure through the supply passage of the spline shaft to hold an electronic component;
a spline nut connected to the spline shaft through a spline mechanism; and
a bearing supporting the spline shaft in the shaft hole in the support both in a linearly movable manner in an axial direction and in a rotatable manner about an axis thereof,
wherein
the bearing, the conduit, and the spline nut are arranged on an axis of the spline shaft in this order from the component retainer,
the spline shaft has a ball groove extending in an axial direction of the spline shaft and receiving a ball connecting the spline shaft and the spline nut to each other through a spline mechanism,
the ball groove is provided only on an upper portion of the spline shaft where the spline nut is disposed and is not provided on a portion corresponding to the conduit and a portion corresponding to the bearing located below the spline nut,
the spline shaft has the ball groove and a restrictor at an end portion of the ball groove, the restrictor being configured to restrict the ball from getting stuck in an incomplete groove having a depth gradually decreasing toward a distal end,
the spline shaft has an annular groove having an annular shape at a border between the incomplete groove and the ball groove, and
the restrictor is a ball stopper disposed in the annular groove at the border between the incomplete groove and the ball groove, the ball stopper being configured to restrict the ball in the ball groove from moving into the incomplete groove;
a base having a through hole in which the conduit and the support are disposed one above the other and through which the spline shaft extends in the axial direction;
the valve in a mounting hole in the base and in communication with the conduit;
an axial driver connected to the spline shaft to move the spline shaft in the axial direction; and
a rotational driver connected to the spline nut to transmit torque to the spline nut to rotate the spline shaft about an axis thereof.

20. A surface mounter comprising
a mounting shaft device configured to mount an electronic component, the mounting shaft device comprising:
a spline shaft including a supply passage for air pressure therein and extending through a shaft hole in a support;
a conduit in communication with a valve and allowing the air pressure from the valve to be introduced to the supply passage of the spline shaft;

a component retainer located at an axial end of the spline shaft and configured to receive the air pressure through the supply passage of the spline shaft to hold an electronic component;

a spline nut connected to the spline shaft through a spline mechanism; and a bearing supporting the spline shaft in the shaft hole in the support both in a linearly movable manner in an axial direction and in a rotatable manner about an axis thereof, wherein the bearing, the conduit, and the spline nut are arranged on an axis of the spline shaft in this order from the component retainer, the spline shaft has a ball groove extending in an axial direction of the spline shaft and receiving a ball connecting the spline shaft and the spline nut to each other through a spline mechanism, the ball groove is provided only on an upper portion of the spline shaft where the spline nut is disposed and is not provided on a portion corresponding to the conduit and a portion corresponding to the bearing located below the spline nut, the spline shaft has the ball groove and a restrictor at an end portion of the ball groove, the restrictor being configured to restrict the ball from getting stuck in an incomplete groove having a depth gradually decreasing toward a distal end, the spline shaft has an annular groove having an annular shape at a border between the incomplete groove and the ball groove, and the restrictor is a ball stopper disposed in the annular groove at the border between the incomplete groove and the ball groove, the ball stopper being configured to restrict the ball in the ball groove from moving into the incomplete groove;

a base having a through hole in which the conduit and the support are disposed one above the other and through which the spline shaft extends in the axial direction;

the valve in a mounting hole in the base and in communication with the conduit;

an axial driver connected to the spline shaft to move the spline shaft in the axial direction; and a rotational driver connected to the spline nut to transmit torque to the spline nut to rotate the spline shaft about an axis thereof;

wherein the surface mounter is configured to mount an electronic component held by the component retainer of the mounting head onto a board.

\* \* \* \* \*